US012434265B2

(12) United States Patent
Hiraren et al.

(10) Patent No.: US 12,434,265 B2
(45) Date of Patent: Oct. 7, 2025

(54) COATING METHOD

(71) Applicant: TOKUYAMA CORPORATION, Shunan (JP)

(72) Inventors: Toshimitsu Hiraren, Tsukuba (JP); Yoshihiro Asahara, Hikari (JP); Takashi Tamukai, Kamisu (JP)

(73) Assignee: TOKUYAMA CORPORATION, Shunan (JP)

( * ) Notice: Subject to any disclaimer, the term of this patent is extended or adjusted under 35 U.S.C. 154(b) by 176 days.

(21) Appl. No.: 17/627,237

(22) PCT Filed: Jul. 17, 2020

(86) PCT No.: PCT/JP2020/027935
§ 371 (c)(1),
(2) Date: Jan. 14, 2022

(87) PCT Pub. No.: WO2021/015138
PCT Pub. Date: Jan. 28, 2021

(65) Prior Publication Data
US 2022/0234072 A1    Jul. 28, 2022

(30) Foreign Application Priority Data

Jul. 19, 2019 (JP) .................................. 2019-133972
Mar. 17, 2020 (JP) .................................. 2020-047016

(51) Int. Cl.
*B05D 1/40* (2006.01)
*B05D 3/00* (2006.01)
(Continued)

(52) U.S. Cl.
CPC ............... *B05D 1/40* (2013.01); *B05D 3/007* (2013.01); *B05D 3/12* (2013.01); *G02B 1/11* (2013.01);
(Continued)

(58) Field of Classification Search
CPC .......... B05D 1/002; B05D 1/005; B05D 1/40; B05D 3/007; B05D 3/12; B05D 2203/35;
(Continued)

(56) References Cited

U.S. PATENT DOCUMENTS 4,559,662 A * 12/1985 Kunold, Jr. .......... G02C 13/008
15/97.1
5,470,892 A * 11/1995 Gupta .................... G02B 1/041
522/42
(Continued)

FOREIGN PATENT DOCUMENTS

CN        101346190 A      1/2009
CN        102869632 A      1/2013
(Continued)

OTHER PUBLICATIONS

International Search Report, issued in PCT/JP2020/027935, PCT/ISA/210, dated Sep. 24, 2020.
(Continued)

*Primary Examiner* — Brian K Talbot
(74) *Attorney, Agent, or Firm* — Birch, Stewart, Kolasch & Birch, LLP

(57) ABSTRACT

The present invention provides a coating method including: a step of supplying a coating agent to a surface of a lens base material; a spreading step of spreading the coating agent supplied to the surface by rotation of the lens base material; a first removal step of removing at least a part of a liquid pool of the coating agent generated on a peripheral edge portion and/or a side surface portion of the lens base material by rotation of the lens base material after the spreading step; and a second removal step of removing the liquid pool remaining on the peripheral edge portion and/or the side surface portion of the lens base material by bringing an adsorption member into contact with at least the side surface of the lens base material after the first removal step. Accord-
(Continued)

ing to the present invention, it is possible to provide a coating method capable of obtaining a base material having a coating layer excellent in uniformity of film thickness by reducing the liquid pool of the coating agent generated on the peripheral edge portion and/or the side surface portion of the lens base material when the coating layer is formed on the surface of the base material by spin coating the coating agent.

11 Claims, 3 Drawing Sheets

(51) Int. Cl.
  *B05D 3/12* (2006.01)
  *G02B 1/11* (2015.01)
  *G02B 1/14* (2015.01)
  *B05D 1/00* (2006.01)
  *B05D 1/02* (2006.01)
  *G03F 7/16* (2006.01)
  *H01L 21/67* (2006.01)

(52) U.S. Cl.
  CPC ............... *G02B 1/14* (2015.01); *B05D 1/005* (2013.01); *B05D 1/02* (2013.01); *B05D 2203/35* (2013.01); *G03F 7/162* (2013.01); *H01L 21/67051* (2013.01); *H01L 21/6715* (2013.01)

(58) Field of Classification Search
  CPC ......... G02B 1/11; G02B 1/14; H01L 21/6715; H01L 21/67051; G03F 7/162
  USPC .......................................................... 427/240
  See application file for complete search history.

(56) References Cited

U.S. PATENT DOCUMENTS

| | | | | |
|---|---|---|---|---|
| 5,914,174 A * | 6/1999 | Gupta | ..................... | C09D 4/00 359/321 |
| 5,989,628 A * | 11/1999 | Haga | ........................ | G02B 1/18 427/407.1 |
| 2003/0190547 A1 * | 10/2003 | Kobayashi | ............. | G03G 15/75 430/119.71 |
| 2005/0148285 A1 * | 7/2005 | Hosoda | ................ | G02C 13/006 451/41 |
| 2007/0065633 A1 * | 3/2007 | Mori | ...................... | G02B 1/041 428/137 |
| 2009/0011126 A1 | 1/2009 | Mori et al. | | |
| 2009/0133625 A1 * | 5/2009 | Takahashi | ........... | B05B 13/0221 118/712 |
| 2009/0285982 A1 | 11/2009 | Mori et al. | | |
| 2009/0324956 A1 | 12/2009 | Otani et al. | | |
| 2010/0086700 A1 * | 4/2010 | Takahashi | .............. | B05D 1/005 427/508 |
| 2014/0083456 A1 * | 3/2014 | Ramsey | ................... | B08B 3/04 15/21.1 |
| 2015/0210056 A1 | 7/2015 | Bosshard et al. | | |
| 2016/0279886 A1 * | 9/2016 | Lynch | ............. | B29D 11/00009 |
| 2016/0318147 A1 * | 11/2016 | Meschenmoser | ............................ | B29D 11/00942 |
| 2017/0293051 A1 * | 10/2017 | Kawasaki | ............ | G02B 1/14 |
| 2018/0341121 A1 * | 11/2018 | Goto | ........................ | G02C 7/02 |
| 2019/0092950 A1 * | 3/2019 | Phan | ....................... | G03C 1/74 |
| 2020/0017708 A1 * | 1/2020 | Ishizaki | .................. | B32B 27/20 |

FOREIGN PATENT DOCUMENTS

| | | | |
|---|---|---|---|
| JP | 2002278104 A | * | 9/2002 |
| JP | 2002-287385 A | | 10/2002 |
| JP | 2004-50108 A | | 2/2004 |
| JP | 2004050108 A | * | 2/2004 |
| JP | 2005-246267 A | | 9/2005 |
| JP | 2005-246268 A | | 9/2005 |
| JP | WO2008/001875 A1 | | 1/2008 |
| JP | 2008-168282 A | | 7/2008 |
| JP | 2013-54096 A | | 3/2013 |
| JP | 2016-74868 A | | 5/2016 |
| JP | 2016-180806 A | | 10/2016 |
| WO | WO 2007/102330 A1 | | 9/2007 |
| WO | WO 2008/093613 A1 | | 8/2008 |

OTHER PUBLICATIONS

Office Action issued in Chinese Application No. 202080050905.3 dated Oct. 19, 2022, with English translation.
Japanese Office Action for corresponding Japanese Application No. 2021-534007, dated Sep. 24, 2024, with English translation.

* cited by examiner

COATING METHOD

TECHNICAL FIELD

The present invention relates to a coating method for forming a coating layer on a surface of a lens base material.

BACKGROUND ART

As a method of forming a coating layer on a surface of a base material such as a lens base material, a method called spin coating is known in which a coating agent is supplied onto a lens base material and the lens base material is rotated to spread the coating agent on the surface of the lens base material to provide a coating layer. Spin coating can form a relatively thin and uniform coating layer on the surface of a base material, and is applied in various industrial fields.

However, in the coating method in which the coating agent is spread on the surface of the lens base material by rotating the lens base material, when the coating agent is spread, a liquid pool of the coating agent may be generated on a peripheral edge portion and/or a side surface portion of the surface of the lens base material. If the liquid pool is generated during the spreading, the thickness of the coating layer formed on the peripheral edge portion becomes thicker than that of the other portion, and there is a problem that the thickness of the formed coating layer cannot be made uniform over the entire surface. In addition, a liquid pool is formed on the side surface portion, which causes a problem that the appearance of the lens is deteriorated. When a coating layer is formed on a lens base material, a portion where the thickness of the formed coating layer is non-uniform cannot be used as a lens, and a problem arises that an effective area usable as a lens after the formation of the coating layer is reduced.

As a conventional technique for solving the problem of an increase in thickness of a coating layer formed on the peripheral edge portion and/or the side surface portion, there is a technique of using a lens base material having a flange portion to be removed after the formation of the coating layer (see PTL 1). However, such a technique has a problem in that the shape of the lens base material used for coating becomes complicated, and a step of removing the flange portion after the formation of the coating layer is required, which takes time and labor for producing.

In addition, as a conventional technique corresponding to the same problem, a technique of removing a liquid pool formed on the peripheral edge portion and/or the side surface portion of a base material when a coating agent is spread using a spatula or a ring has been proposed (see PTL 2). However, in such a technique, if the contact state of the spatula or the like with a liquid pool or the shape of a minute gap formed between the tip of the spatula and the peripheral edge portion of the base material is slightly changed, the liquid pool cannot be appropriately removed. For this reason, there are problems in that it is necessary to replace the spatula or adjust the arrangement of the spatula in accordance with a change in the shape of the lens base material, and it takes time and effort to adjust manufacturing facilities, and in that the removal state of the liquid pool tends to become unstable due to the influence of variations in the holding posture of the rotating lens base material.

In addition, as a conventional technique corresponding to the same problem, a technique has been proposed in which a liquid pool formed on the peripheral edge portion and/or the side surface portion of a base material when a coating agent is spread is removed by suction (see PTL 3). However, in such a technique, the removal state of the liquid pool may not be stabilized due to a difference in the shape of the lens base material used, and the suction pressure may adversely affect the uniformity of the coating liquid on the surface of the lens base material.

CITATION LIST

Patent Literature

[PTL 1] JP 2013-054096 A
[PTL 2] JP 2004-050108 A
[PTL 3] JP 2016-180806 A
[PTL 4] JP 2005-246267 A
[PTL 5] WO 2008/093613

SUMMARY OF INVENTION

Technical Problem

In addition, removal of the liquid pool by an adsorption member such as a sponge has also been studied (see PTLs 4 and 5). PTL 4 describes a method of smoothing a coating layer while removing a coating agent guided to a side surface (edge surface) of a lens base material using a spatula with a sponge. Further, PTLs 4 and 5 also describe that the coating agent is scattered by rotation of a lens base material. However, in PTLs 4 and 5, it is not specified which state of the lens base material the sponge is brought into contact with to remove the liquid pool. In particular, in PTL 5, an aspect of using a sponge is an aspect of PTL 4 corresponding to the prior art of PTL 5, and the invention of PTL 5 itself is not a method of removing a liquid pool by a sponge.

Therefore, in a method of producing a lens having a coat layer (hereinafter, simply referred to as a "coated lens" in some cases) by applying a coating agent to a lens base material by a spin coating method, it has been desired to develop a method capable of highly adjusting the thickness of the peripheral edge portion of the lens base material and the appearance of the lens in particular by a simpler method.

The present invention has been made in view of such problems, and provides a coating method capable of suitably removing a liquid pool formed on a peripheral edge portion and/or a side surface portion of a base material when a coating agent is spread. Further, the present invention provides a method for producing a photochromic lens using the coating method.

Solution to Problem

In order to solve the above-described problems, the present inventors have conducted intensive studies. Then, as a method capable of removing a liquid pool from a peripheral edge portion and/or a peripheral edge portion of a lens base material in a relatively stable manner, studies have been made focusing on the use of an adsorption member. As a result, it has been found that it is important to prevent the liquid pool from becoming large as much as possible before the adsorption member is brought into contact. Then, the present inventors have found that the following method can be used to produce a high-quality coated lens by further using an adsorption member while easily removing a liquid pool, and have completed the present invention.

According to a first aspect of the present invention, there is provided a coating method including:

a step of supplying a coating agent to a surface of a lens base material;

a spreading step of spreading the coating agent supplied to the surface by rotation of the lens base material;

a first removal step of removing at least a part of a liquid pool of the coating agent generated on a peripheral edge portion and/or a side surface portion of the lens base material by rotation of the lens base material after the spreading step; and a second removal step of removing the liquid pool remaining on the peripheral edge portion and/or the side surface portion of the lens base material by bringing an adsorption member into contact with at least the side surface of the lens base material after the first removal step.

In the first aspect of the present invention, in order to produce a higher-quality coated lens, it is preferable that the adsorption member contains an organic solvent. When the adsorption member contains an organic solvent, the liquid pool can be further reduced, and a high-quality coated lens can be produced. The adsorption member is preferably brought into contact with a side surface of the lens base material. By bringing the adsorption member into contact with the side surface of the lens base material, the liquid pool in the peripheral edge portion and/or the side surface portion of the lens base material can be easily removed.

The second aspect of the present invention relates to a method of producing a coated lens using the first aspect of the present invention.

Advantageous Effects of Invention

The present invention solves the problem of the liquid pool in the peripheral edge portion and/or the side surface portion of the lens base material occurring in the spin coating method by a first removal step of removing the liquid pool by rotation of the lens base material itself and a second removal step of further removing the remaining liquid pool by the adsorption member. Therefore, a high-quality coated lens can be produced by a simple method.

When a sponge is used as the adsorption member, the sponge itself is flexible and can be easily deformed. For this reason, the adsorption member can be easily brought into contact with the peripheral edge portion of the lens base material, in particular, the side surface thereof, and the liquid pool can be removed. In addition, in the case of a foamed resin, particularly a sponge, it becomes easy to absorb an organic solvent. By using an adsorption member containing the organic solvent, when combined with the first removal step, the liquid pool can be removed at a higher level, and a high-quality coated lens can be produced.

DESCRIPTION OF EMBODIMENTS

Figure 1:
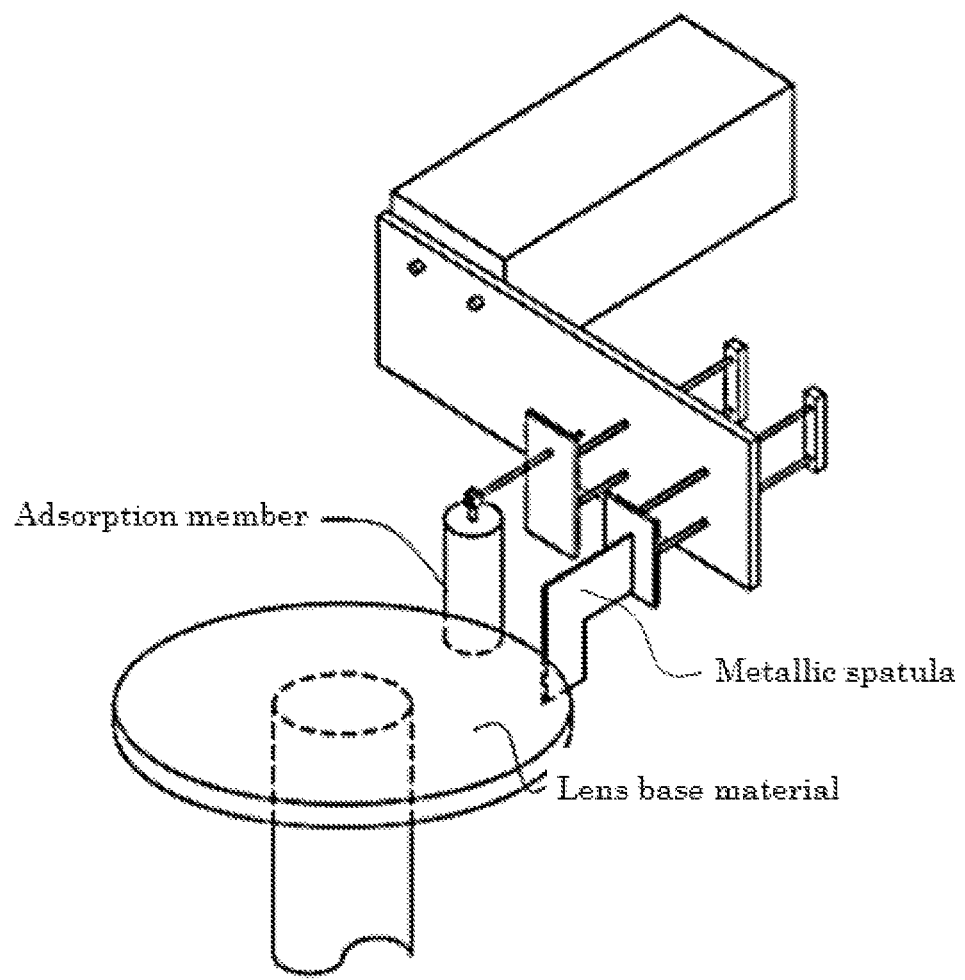
FIG. 1 is a view showing a representative embodiment using an adsorption member according to the present invention.

A coating method of the present invention includes:
a step of supplying a coating agent to a surface of a lens base material;
a spreading step of spreading the coating agent supplied to the surface by rotation of the lens base material;

a first removal step of removing at least a part of a liquid pool of the coating agent generated on a peripheral edge portion and/or a side surface portion of the lens base material by rotation of the lens base material after the spreading step; and a second removal step of removing the liquid pool remaining on the peripheral edge portion and/or the side surface portion of the lens base material by bringing an adsorption member into contact with at least the side surface of the lens base material after the first removal step.

The liquid pool is generated only in the peripheral edge portion of the lens base material, only in the side surface portion of the lens base material, or in both the peripheral edge portion of the lens base material and the side surface portion of the lens base material. According to the method of the present invention, in any case, the liquid pool can be removed, and a high-quality coated lens can be produced.

Hereinafter, the present invention will be described in detail with reference to specific embodiments.

(Lens Base Material)

The lens base material in the present invention is not particularly limited, and lens base materials having various shapes can be used. For example, the lens may be a finish lens in which an optical power is formed, or may be a semi-finish lens other than the finish lens.

Above all, the method of the present invention can be suitably applied to a finish lens. In a semi-finished lens used for a spectacle lens, since a rear surface of the lens is polished and processed to have a desired power in a subsequent processing step, and thus a coating defect on the rear surface may be negligible. On the other hand, in the case where the finish lens is used, after the coat layer is formed, hard coating and anti-reflection coating processing are performed as they are. Therefore, the appearance at the time of forming the coat layer is particularly important. In particular, when these lens base materials are used, it is desired that the difference in thickness of the peripheral edge portion is small and the appearance including the side surface portion is better at the time of forming the coat layer. When the lens base material is used for a normal spectacle lens, the lens base material has a circular shape having a diameter of 30 to 200 mm, and preferably 50 to 100 mm, a central thickness of 0.5 to 30 mm, and preferably 0.5 to 20 mm, and a thickness (width) of a side surface (edge surface) of the lens base material of 0.5 to 30 mm, and preferably 0.5 to 20 mm. The base curve of the surface of the lens base material is preferably 20 or less, and more preferably 15 or less. The lower limit value of the curvature is not particularly limited, but is 0.5.

Further, the material of the lens base material is not particularly limited, and may be a glass lens or a plastic lens. Examples of the plastic lens include lenses produced using a (meth)acrylic resin, a polycarbonate resin, an allyl resin, a thiourethane resin, a urethane resin, a thioepoxy resin, and the like. The plastic lens may be subjected to a chemical treatment with an alkali solution, an acid solution, or the like, or a physical treatment with corona discharge, plasma discharge, polishing, or the like in order to improve adhesion of the resulting coating layer.

The lens base material may or may not have a coat layer on its surface in advance. A lens base material having a primer coat layer, a protective layer, or a hard coat layer on its surface can also be used in the present invention. The primer coat layer or the protective layer is formed as an adhesive layer for enhancing adhesion between the lens base material and other coating layers. In addition, for another purpose, the primer coat layer, the protective layer, or the hard coat layer is formed as a protective layer that protects the lens base material from the coating layer formed thereon. As a method of forming the primer coat layer, the protective layer, or the hard coat layer, a known method such as a spin coating method or a dipping method is employed. Examples of the coating material (material for forming the primer coat layer, the protective layer, or the hard coat layer) include, but are not particularly limited to, urethane resins, epoxy resins, acrylic resins, and silicone resins in which metal oxide particles such as silica formed by a sol-gel method are dispersed.

The method of the present invention is a method for producing a coated lens by supplying a coating agent to the surface of a lens base material and forming a coat layer on the surface of the lens base material, and the coating agent used is not particularly limited. Therefore, the method of the present invention can be suitably employed also in the case where the coating layer previously provided on the lens base material is formed on the surface of the lens base material by a spin coating method. That is, the present invention can also be suitably employed in the case of employing a method (spin coating method) of spreading a primer composition for forming a primer coat layer on the surface of a lens base material by rotation of the lens base material.

The present invention can be employed when the coating layer and other functional coat layers are formed by a spin coating method (a method in which a coating agent is spread by rotation of a lens base material). Next, specific examples in the case of forming these coating layers will be described.

(Step of Supplying Coating Agent)

In the present invention, by using a spin coating apparatus provided with a lens base material rotating means, a coating agent supplying means, and an adsorbing means by an adsorbing member, first, the lens base material is installed in the spin coating apparatus, and then the coating agent is supplied to the surface of the lens base material. Next, the lens base material is rotated at a predetermined rotational speed to spread the coating agent supplied onto the lens base material. At this time, a liquid pool of the coating agent is formed on the peripheral edge portion and/or the side surface portion of the lens base material.

(Spreading Step, First Removal Step, and Second Removal Step; Case where Coating Agent Composed of Primer Composition is Used)

(Composition of Primer Composition, Etc.)

In the case where a primer composition is used as a coating agent, although not particularly limited, it is preferable to use the following composition to make the following thickness. Specifically, from the viewpoint of easily obtaining a primer coat layer having a uniform thickness in a thickness range of 1 to 10 microns, it is preferable to satisfy the following ranges of composition and viscosity. Specifically, the solid content concentration of the primer composition is preferably 10 to 50% by mass. The viscosity at 25° C. is preferably adjusted to a range of 1 to 20 mPa·s, more preferably adjusted to a range of 4 to 10 mPa·s, and particularly preferably adjusted to a range of 4 to 7 mPa·s.

The viscosity can be adjusted by changing the type or amount of the dispersion medium. In particular, primer compositions described in WO2011/096304, JP 2011-219619 A, WO2004/078476, WO2017/039019 and the like are preferably used. The primer composition is not particularly limited, but in order to secure excellent adhesion, it is preferable to use a primer composition containing polyurethane and an organic solvent or a primer composition containing a moisture-curable urethane. In particular, a primer composition containing a moisture-curable urethane is considered to be partially cured when spread on the surface of a lens base material, and the method of the present invention can be suitably applied.

The moisture-curable urethane is a polyurethane resin that is cured by moisture (humidity) in the atmosphere. The polyurethane resin is set so that an isocyanate group remains in a polyurethane molecule, and is a compound obtained by cross-linking and curing in such a manner that a part of a plurality of isocyanate groups present in the molecule reacts with, for example, moisture in the atmosphere to generate a carbamic acid, which is then decarboxylated to generate an amine, and the amine reacts with the remaining isocyanate group to generate a urea bond.

(Spreading Step and First Removal Step; Case where Primer Composition is Used)

In the coating method of the present invention, after the step of supplying the coating agent to the surface of the lens base material is performed, a spreading step of spreading the coating agent supplied to the surface by the rotation of the lens base material is performed.

In the present invention, when the primer composition is used as the coating agent, it is preferable to spread the coating agent by rotating the lens base material at 10 to 500 rpm, although not particularly limited. As described above, the primer composition (coating agent) has a relatively low viscosity. Therefore, in order to more stably form a smoother primer coat layer, it is more preferable to rotate the lens base material at 30 to 300 rpm. The time for which the lens base material is rotated to spread the coating agent may be appropriately determined depending on the configuration and viscosity of the primer composition, the size of the lens base material, and the like, but is preferably 1 to 60 seconds (sec.) in general.

After the spreading step, a first removal step of removing at least a part of the liquid pool of the coating agent generated on the peripheral edge portion and/or the side surface portion of the lens base material by rotation of the lens base material is performed.

In a case where the primer composition is used, it is preferable to remove at least a part of the liquid pool generated on the peripheral edge portion and/or the side surface portion of the lens base material by rotating the lens base material at 500 to 3000 rpm (first removal step). In the first removal step, the rotational speed of the lens base material is preferably higher than the rotational speed of the lens base material in the spreading step described above. From such a viewpoint, the rotational speed of the lens base material in the first removal step is more preferably higher than 500 rpm and lower than or equal to 3000 rpm. By rotating the lens base material within the above range, it is possible to efficiently remove at least a part of the liquid pool while forming a smooth primer coat layer. In order to further enhance this effect, it is more preferable to rotate the lens base material at 800 to 2000 rpm. In particular, by removing the liquid pool by rotating the lens base material under these conditions, more stable production can be performed, and the yield can be further improved. The time for removing at least a part of the liquid pool by rotating the lens base material may be appropriately determined depending on the configuration and viscosity of the primer composition, the desired thickness of the primer coat layer, the size of the lens base material, and the like, but is usually preferably 1 to 60 seconds (sec.), preferably 1 to 30 seconds (sec.), and more preferably 1 to 10 seconds (sec.).

(Second Removal Step; Case where Primer Composition is Used)

In the present invention, when the primer composition is used as a coating agent, at least a part of the liquid pool is preferably removed by the first removal step described above. In the present invention, after the first removal step is performed, a second removal step, that is, a second removal step of bringing an adsorption member into contact with at least the side surface of the lens base material to remove the liquid pool remaining on the peripheral edge portion and/or the side surface portion of the lens base material is performed.

(Second Removal Step; Case where Adsorption Member/Primer Composition is Used)

The adsorption member used in the second removal step further removes the liquid pool remaining on the peripheral edge portion and/or the side surface portion of the lens base material. The material of the adsorption member is not particularly limited as long as it is capable of adsorbing the coating agent. Among them, it is preferable to use a material that does not swell (hardly swells) in a solvent described in detail below. Examples of the adsorption member include a polyurethane, a polyvinyl alcohol, a polyolefin, a fluororesin, a melamine resin, and a polyamide resin. The adsorption member is preferably made of a foamed resin from the viewpoints of adsorption capacity of a coating liquid, durability against repeated adsorption and removal, availability, and processability. Therefore, it is particularly preferable to use a foamed resin made of a polyurethane, a melamine resin, a polyolefin resin, or a polyamide resin. Among these, as described in detail below, the adsorption member preferably contains an organic solvent. In this case, from the viewpoint of solvent resistance, it is particularly preferable to use an adsorption member made of a melamine resin, a polyolefin resin, or a polyamide resin. In particular, by using an adsorption member made of a melamine resin, abrasion resistance is good, and even if the adsorption member contains an organic solvent, shape change due to swelling does not occur, and stable use is possible.

Further, it is preferable to use a material having a hardness of 100 N to 500 N for the adsorption member. When the hardness is less than 100 N, the adsorption capacity of the coating agent is excellent, but the contact area when in contact with the lens base material may be too large. Therefore, the coating liquid tends to be excessively adsorbed, and the evenness of the coating surface tends to decrease (a wrinkle defect tends to occur in a liquid pool at a peripheral edge portion described later). On the other hand, when the hardness is higher than 500 N, it may not be sufficiently close to the lens base material, and the coating agent may not be sufficiently adsorbed. For this reason, the hardness of the adsorption member to be used is preferably 150 N to 400 N, and more preferably 200 N to 350 N. The hardness of the adsorption member is a value measured in accordance with JIS K6400-2 (Method A).

In addition, the material forming the adsorption member is preferably a foamed resin, and above all, an open-cell foamed resin (foamed material) is preferable. A closed-cell foamed material has a lower adsorption capacity than an open-cell foamed material, and may not be sufficiently adsorbed and removed. Therefore, it is preferable to use a so-called sponge as a foamed resin having open cells, which is a typical example of the adsorption member. Further, as described in detail below, the use of a sponge makes it easier to use an organic solvent.

The density of the adsorption member is preferably 5 to 20 kg/m$^3$. In order to efficiently remove the liquid pool and impregnate the organic solvent, the density of the adsorption member is preferably 5 to 15 kg/m$^3$. It is preferable to use a sponge as the adsorption member having such a density range. The density can be adjusted by the material of the sponge, the pore diameter of the pores of the sponge, and the like.

The pore diameter of the sponge is not particularly limited, but is preferably in the following range in order to exhibit particularly excellent effects. Specifically, those having a maximum diameter in a range of 1 to 1000 µm, and further those having a maximum diameter in a range of 10 to 800 µm are preferable when confirmed with an optical microscope. A commercially available sponge can be used as such a sponge. Examples thereof include "Basotect" (registered trademark) series sold by Inoac Corporation.

(Second Removal Step; Case where Adsorption Member Containing Organic Solvent/Primer Composition is Used)

In the present invention, by using the adsorption member, the liquid pool can be easily and stably removed. Among them, in view of further stable production (improvement in yield) of products, it is preferable to use the adsorption member, particularly a sponge containing an organic solvent.

When an organic solvent is used, it is preferable that the organic solvent can be mixed with the material before the primer composition is cured. For example, in the case of a primer composition containing a moisture-curable urethane, it is preferable that the primer composition can be mixed with a urethane monomer (oligomer) before curing or can disperse the urethane monomer (oligomer). Specific examples thereof include alcohol solvents, ketone-based solvents, aromatic solvents, halogen-based solvents, and ester-based solvents. Among them, ketone-based solvents are preferably used in consideration of ease of handling, influence on the human body, and effect of removing the liquid pool, and in particular, acetone, methyl ethyl ketone, and methyl isobutyl ketone are most preferably used.

In particular, when the organic solvent is a ketone-based solvent and the material forming the adsorption member is a foamed resin, or when the organic solvent is a ketone-based solvent and the material forming the adsorption member is a melamine resin, the effect of removing the liquid pool is further improved, which is preferable.

When the adsorption member contains an organic solvent, the amount of the organic solvent contained in the adsorption member is preferably adjusted so as to contain 0.1 to 2 g of the organic solvent per 1 cm$^3$ volume of the adsorption member, although there is no particular limitation. By including the organic solvent in this range, the liquid pool can be efficiently and stably removed, and a high-quality coated lens can be obtained. In particular, when a primer composition containing a moisture-curable urethane resin is used, in addition to the removal of the liquid pool, there are cases in which some polymer deposits adhere to the peripheral edge portion and side surface of the lens base material. When the amount of the organic solvent is within the above range, these deposits can also be removed, and a high-quality coated lens can be produced with a high yield. On the other hand, when the amount of the organic solvent contained in the sponge is excessive (for example, when the amount exceeds 2 g per 1 cm$^3$ volume), the organic solvent tends to penetrate into the coating layer, excessively remove the liquid pool, and be subjected to erosion. As a result, there is a high possibility of a wrinkle defect.

(Second Removal Step/Shape of Adsorption Member, Liquid Pool Removal Conditions; Case where Primer Composition is Used)

In the present invention, the shape of the adsorption member is not particularly limited. In particular, the removal of the liquid pool by the adsorption member is preferably performed by bringing the adsorption member into contact with at least the side surface of the lens base material while rotating the lens base material. By being brought into contact with the side surface, the liquid pool in the peripheral edge portion of the lens base material can be easily removed.

(Suitable Arrangement of Adsorption Member; Case where Primer Composition is Used)

In many cases, the primer coat layer formed on the surface of the lens base material is relatively thin as compared with other functional layers. Therefore, as compared with other functional layers, problems of thickness unevenness of the peripheral edge portion of the lens base material and appearance can be easily adjusted by performing the first removal step. However, when the primer composition containing an organic solvent is formed into a thin film (when spin coating is performed), the viscosity may increase as the organic solvent volatilizes (with drying), and the fluidity of the primer composition is likely to decrease. The primer composition tends to be partially dried and cured even before a curing step (a step of forming a primer coat layer from the applied primer composition) described in detail below. Therefore, when the primer composition is used, it is preferable to remove the liquid pool and partially remove the cured product formed on the side surface in the second removal step. In particular, in the case where a composition containing a polyurethane containing an organic solvent, particularly a moisture-curable urethane containing an organic solvent, is used as the primer composition, a cured product on the side surface is easily formed, and thus the following method is preferably used.

That is, the adsorption member is disposed such that the uppermost position of the adsorption member is located at a position 3% to 30% below the length (k) of the side surface from the upper end edge of the side surface of the lens base material. Further, it is preferable that the adsorption member is always in contact with the side surface below the same position as the uppermost position of the adsorption member. By setting the uppermost position of the adsorption member within the above range, it is possible to not only remove the liquid pool but also efficiently remove the cured product. In consideration of removal of the liquid pool and removal of the cured product, the uppermost position of the adsorption member is preferably disposed at a position 5% to 20% below the length (k) of the side surface from the upper end edge of the side surface of the lens base material.

When the uppermost position of the adsorption member is positioned at a position lower than 3% of the length (k) of the side surface from the upper end edge of the side surface of the lens base material, the following defects tend to occur. Specifically, when the adsorption member is disposed at an excessively high position, particularly in a case where the adsorption member contains an organic solvent, there is a possibility that the organic solvent infiltrates into the coating layer (coating film) on the surface of the lens base material from the peripheral edge portion of the lens base material. Alternatively, if the adsorption member is disposed at an excessively high position, the adsorption member itself bends and covers the peripheral edge portion surface of the lens base material, and there is a risk that the primer composition applied to the lens surface is excessively removed. From the above, it is preferable to dispose the adsorption member such that the uppermost position of the adsorption member is located at a lower position where the length of the adsorption member is 3% or more of the length (k) of the side surface from the upper end edge. When the primer composition is excessively removed, a wrinkle defect described below is likely to occur in the peripheral edge portion.

On the other hand, when the uppermost position of the adsorption member is positioned at a lower position exceeding 30% of the length of k, the effect of removing the liquid pool and the cured product tends to decrease.

(Suitable Shape and Contact Condition of Adsorption Member; Case where Primer Composition is Used)

The adsorption member is preferably brought into contact with the side surface of the lens base material at the aforementioned position, but in this case, it is preferable to bring the adsorption member into contact with the side surface while rotating the lens base material. In addition, it is preferable to have the structure such that the contacted adsorption member rotates in the opposite direction in accordance with the rotation of the lens base material. Therefore, the adsorption member to be brought into contact is preferably a cylindrical shape, and it is preferable that a side wall surface of the cylindrical shape serves as a contact portion. In particular, it is preferable to adopt a structure that is rotatable about a cylindrical center axis (central axis of the cylinder). In order to improve operability, it is preferable to use a roller in which the periphery of a rotating shaft that rotates is covered with an adsorption member (a roller in which a rotating shaft is installed in a hollow portion of an adsorption member that is hollow). In this case, the rotating shaft preferably has a diameter of 10 to 50 mm, and the adsorption member preferably has a thickness of 2 to 50 mm (the thickness of the adsorption member at the portion covering the rotating shaft), more preferably 2 to 45 mm, and particularly preferably 5 to 30 mm. Further, in this case, it is sufficient that the height of the adsorption member is from the uppermost position to the lowermost edge of the side surface. However, to be specific, the height is preferably 5 to 50 mm, and more preferably 10 to 40 mm.

The adsorption member having this shape can be used for removing liquid pools from a plurality of lens base materials. The coated lens can be repeatedly used a plurality of times as long as the quality of the obtained coated lens can be maintained. However, in order to stably obtain a high-quality coated lens, it is preferable to adjust the adsorption member to be in the same state every time. The same state means a state in which there is no change in the size or shape of the adsorption member, and in particular, there is no contamination on the surface of the adsorption member that is in contact with the side surface of the lens base material. As a cleaning method of cleaning the adsorption member for this purpose, the following method is exemplified. Specifically, the adsorption member containing the primer composition or the like can be cleaned by periodically immersing the adsorption member in the organic solvent, and then sucking or squeezing out the organic solvent contained in the adsorption member. Among them, the removal of the solvent by suction is a preferable method because the shape of the adsorption member is less likely to change.

(Preferred Embodiment of Adsorption Member; Case where Primer Composition is Used)

The adsorption member to be used is not particularly limited, and an adsorption member made of the above-described material and having the above-described characteristics can be used. Among them, it is preferable to use the sponge described above, and it is further preferable that the sponge contains an organic solvent. In particular, when a primer composition containing a moisture-curable urethane resin is used, a sponge containing an organic solvent is preferably used. Among them, when an organic solvent is used, it is preferable to use a ketone-based solvent, and the amount thereof is preferably 0.1 to 2 g per 1 $cm^3$ of the sponge as described above. In particular, when a primer composition containing a moisture-curable urethane resin is used, the amount of the organic solvent per 1 $cm^3$ of the sponge is preferably 0.2 to 1.5 g, and more preferably 0.3 to 1 g.

When an adsorption member containing an organic solvent is used, a plurality of lens base materials can be treated as long as the amount of the organic solvent falls within the above range. However, in order to obtain a higher-quality coated lens, the amount of the organic solvent is preferably adjusted to fall within the above range (the amount of the organic solvent per 1 $cm^3$ of the sponge is 0.1 to 2 g, preferably 0.2 to 1.5 g, and more preferably 0.3 to 1 each time. It is preferable that the organic solvent is automatically supplied and its content is adjusted so that the content of the organic solvent falls within a suitable range.

(Suitable Contact Conditions of Adsorption Member; Case where Primer Composition is Used)

As described above, the adsorption member is preferably in contact with the side surface of the lens base material in a rotated state. In particular, when the primer composition is used, it is preferable to bring the adsorption member into contact with the side surface under the following conditions. To be specific, in order to stably remove the liquid pool and the cured product, the pressing load (hereinafter, may be referred to as contact force) is preferably 20 to 200 g, and more preferably 30 to 150 g. As a method of adjusting the load, a method of pressing the adsorption member against the side surface of the lens base material by a means having a spring can be employed. Specifically, a method of appropriately adjusting the coefficient of a "spring" attached to the root portion (in FIG. 2) of an adsorption member (for example, a cylindrical sponge) can be employed.

The rotational speed of the lens base material at the time of contact is preferably 30 to 200 rpm, and is preferably 50 to 100 rpm in order to more stably remove the liquid pool and the cured product. The contact time may be determined as appropriate, but is usually preferably 1 to 60 seconds (sec.), more preferably 1 to 30 seconds (sec.), and still more preferably 1 to 20 seconds (sec.).

When the primer composition is used by the above-described method, the primer composition is preferably treated. Next, a method of curing the coating agent applied to the surface of the lens base material when the primer composition is used will be described.

(Coat Layer, Method of Forming Coat Layer: Case where Primer Composition is Used)

After the liquid pool is removed by the above-described method, the lens base material coated with the coating agent is treated by a known method, whereby a primer coat layer can be formed on the surface of the lens base material. That is, depending on the material contained in the primer composition, a curing method suitable for each material may be employed.

For example, in the case where a polymerizable monomer (including an oligomer) and a thermal polymerization initiator and/or a photopolymerization initiator are contained, curing may be performed under conditions in which the polymerizable monomer is thermally polymerized and/or photopolymerized. Further, in the case of a primer composition containing a polymer and an organic solvent, curing may be performed under conditions in which the organic solvent is dried. In the case where a primer composition containing a moisture-curable urethane is used, it is preferable to cure the primer composition by humidification and, if necessary, heating. Specifically, it is preferable to cure the primer composition containing a moisture-curable urethane under conditions of a humidity of 10 to 80% and a temperature of 20 to 120° C.

In the resulting coated lens, the film thickness of the primer coat layer is not particularly limited, but is preferably 0.1 to 10 µm, and more preferably 1 to 10 µm.

In the case of a primer coat layer having such a film thickness, it may be difficult to distinguish the difference in "(Evaluation of Width of Liquid Pool)" and "(Evaluation of Wrinkles in Liquid Pool)" described in detail below. Wrinkles in the liquid pool are considered to be defects caused by excessive removal (erosion) of the coating film (coating film) at the peripheral edge portion due to penetration of the organic solvent contained in the adsorption member into the coating layer or due to pushing of the adsorption member to the surface of the lens base material. In the case of forming a primer coat layer, a cured product may adhere to the side surface. In particular, in the case of using a primer composition containing a moisture-curable urethane, there is a possibility that adhesion of such a cured product becomes a problem. In particular, in the case of a finish lens which immediately proceeds to the next step as it is, there is a serious problem in appearance. The cured product can be removed by treating (for example, polishing) the side surface, but this is not a preferable operation because the number of steps is increased. In the present invention, as will be described in detail below, when a primer coat layer was laminated on 20 lens base materials, the yield was evaluated.

In the present invention, a lens base material having a primer coat layer on its surface (hereinafter, may be simply referred to as a "primer coat lens base material") can be produced by the above-described method. In the present invention, the primer coat lens can be used as a lens base material, and a functional layer can be further coated thereon. The functional layer is not particularly limited, but may be a layer containing various dyes and ultraviolet absorbers. Above all, the method of the present invention can be suitably employed when a coating agent composed of a photochromic curable composition containing a photochromic compound and a polymerizable monomer is used.

That is, in the present invention, the coating layer can be formed a plurality of times on the surface of the lens base material, and as described above, after the primer composition is coated on the lens base material to form a primer coat layer, the photochromic curable composition can be coated on the primer layer to form a photochromic coat layer.

In other words, the step of supplying the coating agent, the spreading step, the first removal step, and the second removal step can be repeatedly performed in this order. For example, a coating agent composed of a primer composition is supplied onto a lens base material and subjected to the spreading step, the first removal step, and the second removal step to form a primer coat layer, and then a photochromic curable composition described later is supplied onto the primer coat layer and subjected to the spreading step, the first removal step, and the second removal step to form a photochromic coat layer. In this manner, a photochromic lens can be produced by forming a primer coat layer and a photochromic coat layer on the lens base material.

Next, the case of using a coating agent composed of the photochromic curable composition will be described.
(Lens Base Material; Case of Forming Functional Layer)

In the present invention, even when a functional layer containing a photochromic compound is formed, the same lens base material as that described in the above "(Lens Base Material)" can be used.

Among them, the primer coat lens base material described above can be preferably used. Among them, the method of the present invention can be suitably employed in the case where the thickness of the primer coat layer is 1 to 10 μm, and more preferably 3 to 10 μm in the primer coat lens base material. As described above, when the thickness of the primer coat layer is about 10 μm, since the primer coat layer is a relatively thin film, the thickness and wrinkles of the peripheral edge portion of the primer coat lens base material itself may not cause a significant problem. However, when a primer coat layer is present and a functional layer is formed on the primer coat layer, the problems of the thickness and wrinkles of the peripheral edge portion are important. The present invention can efficiently solve the problems of the thickness and wrinkles when a functional layer is formed on the primer coat layer of such a primer coat lens base material. In particular, when a primer coat lens base material having a primer coat layer on a finish lens is used, the method of the present invention can be suitably employed.
(Step of Supplying Coating Agent)

In the present invention, as described above, the functional layer can be laminated using a spin coating apparatus provided with a lens base material rotating means, a coating agent supplying means, and an adsorbing means by an adsorbing member. A known method can be employed for supplying the coating agent. The liquid pool can be formed as described above.
(Spreading Step, First Removal Step, and Second Removal Step; Case where Coating Agent Serving as Functional Layer is Used)
(Regarding Composition of Coating Agent that Forms Functional Layer, Etc.)

When a functional layer is formed, a coating agent having a relatively high viscosity is often used to form a thick coat layer. For this reason, particularly in the coating of the finish lens, the thickness and wrinkles of the peripheral edge portion become problems.

The coating agent for forming the functional layer is not particularly limited. In particular, when the coating film thickness of the functional layer is 10 to 100 microns, the viscosity (at 25° C.) is preferably 20 to 5000 mPa·s, more preferably 50 to 1000 mPa·s, still more preferably 70 to 500 mPa·s or less, and particularly preferably 100 to 300 mPa·s. In particular, when a coating agent composed of a photochromic curable composition containing a photochromic compound and a polymerizable monomer is used, it is preferable that the viscosity is satisfied. In the case where the coating agent contains a photochromic compound, in particular, by satisfying the viscosity range described above, the thickness of the coat layer can be relatively increased. Since a thick film is obtained, the method of the present invention can be suitably employed. Next, the photochromic curable composition will be described.
(Regarding Composition of Coating Agent Composed of Photochromic Curable Composition, etc.)

The photochromic curable composition (hereinafter may be simply referred to as "photochromic liquid") contains a photochromic compound and a polymerizable monomer, and preferably contains (a) a photochromic compound, (b) a polymerizable monomer, and (c) a photopolymerization initiator as constituent components.
(Photochromic Compound)

As the photochromic compound (a), known photochromic compounds can be used without any limitation. For example, photochromic compounds such as fulgimide compounds, spirooxazine compounds, and chromene compounds can be used.

Among these photochromic compounds, chromene-based photochromic compounds can be particularly preferably used because they have higher durability of photochromic properties than other photochromic compounds and are particularly superior to other photochromic compounds in terms of color density and fading speed of photochromic properties.

Specific examples of chromene-based photochromic compounds that can be suitably used in the present invention include the following compounds.

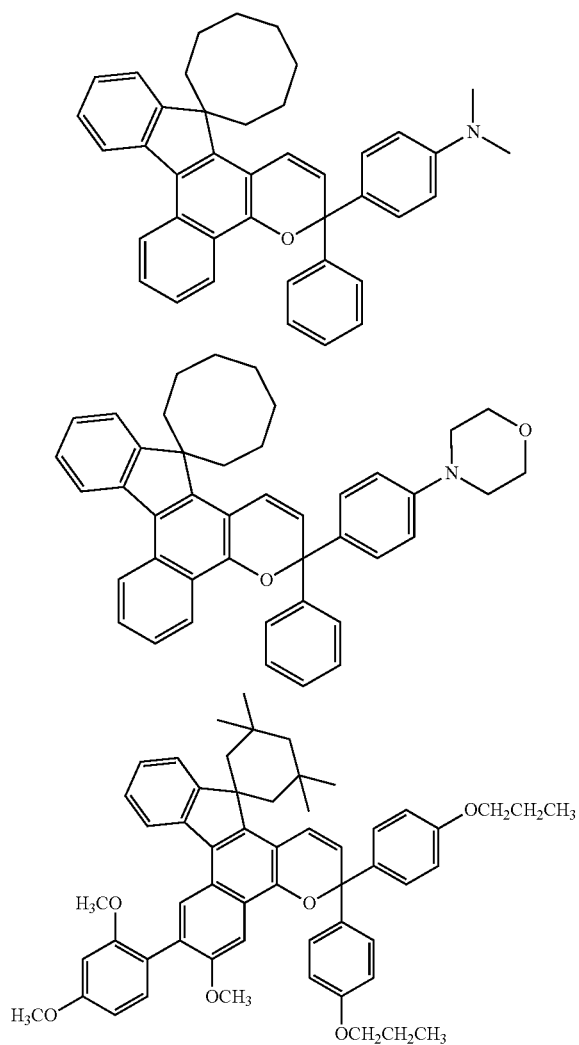

A plurality of types of the photochromic compound (a) may be appropriately mixed and used in order to obtain a desired color tone.

The blending amount of the photochromic compound (a) is preferably 0.01 to 20 parts by mass, more preferably 0.05 to 15 parts by mass, and most preferably 0.1 to 10 parts by mass with respect to 100 parts by mass of the polymerizable monomer (b) blended in the photochromic liquid. Within this range, the photochromic compound can be easily dissolved uniformly in the polymerizable monomer while obtaining a sufficient color density, and thus the color density can be easily made sufficient and uniform.

(Polymerizable Monomer)

As the polymerizable monomer (b), a known radical polymerizable monomer can be used without any limitation depending on the purpose such as improvement of surface hardness, improvement of impact resistance, and improvement of adhesion to a hard coat layer or an anti-reflection layer provided as an outer layer.

(Radical Polymerizable Monomer)

Specific examples of such radical polymerizable monomers include trimethylolpropane trimethacrylate, trimethylolpropane triacrylate, tetramethylolmethane trimethacrylate, tetramethylolmethane triacrylate, tetramethylolmethane tetramethacrylate, tetramethylolmethane tetraacrylate, trimethylolpropane triethylene glycol trimethacrylate, trimethylolpropane triethylene glycol triacrylate, ditrimethylolpropane tetramethacrylate, ditrimethylolpropane tetraacrylate, dipentaerythritol hexaacrylate, bisphenol A dimethacrylate, 2,2-bis(4-methacryloyloxy ethoxyphenyl)propane, 2,2-bis(4-methacryloyloxy polyethylene glycol phenyl)propane having an average molecular weight of 628, 2,2-bis(4-methacryloyloxy polyethylene glycol phenyl)propane having an average molecular weight of 804, 2,2-bis(4-acryloyloxy polyethylene glycol phenyl)propane having an average molecular weight of 776, methoxypolyethylene glycol methacrylate having an average molecular weight of 468, diethyleneglycol dimethacrylate, triethylene glycol dimethacrylate, tetraethyleneglycol dimethacrylate, pentaethyleneglycol dimethacrylate, pentapropyleneglycol dimethacrylate, diethyleneglycol diacrylate, triethylene glycol diacrylate, tetraethyleneglycol diacrylate, pentaethyleneglycol diacrylate, tripropyleneglycol diacrylate, tetrapropyleneglycol diacrylate, pentapropyleneglycol diacrylate, polyethylene glycol dimethacrylate having an average molecular weight of 330, polyethylene glycol dimethacrylate having an average molecular weight of 536, polytetramethylene glycol dimethacrylate having an average molecular weight of 736, tripropylene glycol dimethacrylate, tetrapropylene glycol dimethacrylate, polypropylene glycol dimethacrylate having an average molecular weight of 536, polyethylene glycol diacrylate having an average molecular weight of 258, polyethylene glycol diacrylate having an average molecular weight of 308, polyethylene glycol diacrylate having an average molecular weight of 508, polyethylene glycol diacrylate having an average molecular weight of 708, polycarbonate di(meth)acrylate which is a reaction product of polycarbonate diol and (meth)acrylic acid, polyfunctional urethane (meth)acrylate such as urethane oligomer tetraacrylate, urethane oligomer hexamethacrylate, and urethane oligomer hexaacrylate, polyfunctional polyester (meth)acrylate such as polyester oligomer hexaacrylate, silsesquioxane monomer having a (meth)acrylic group and having various structures such as cage, ladder and random, and 2-isocyanatoethyl methacrylate.

The radical polymerizable monomer may be used by appropriately mixing two or more kinds thereof in consideration of solvent resistance after curing of the coating agent, characteristics of a cured body such as hardness and heat resistance, and the like.

In addition, the radical polymerizable monomer may include a radical polymerizable monomer having at least one epoxy group and at least one radical polymerizable group in a molecule (hereinafter, simply referred to as an epoxy-based monomer in some cases) in addition to the above-described monomers.

By using the epoxy-based monomer as a component of the radical polymerizable monomer, the adhesion between the coating layer and the lens base material is improved.

As such an epoxy-based monomer, a known compound can be used without any limitation, but a compound having a (meth)acryloyloxy group as a radical polymerizable group is preferable.

Specific examples of the epoxy-based monomer include glycidyl acrylate, glycidyl methacrylate, β-methylglycidyl methacrylate, bisphenol A-monoglycidyl ether methacrylate, 4-glycidyloxy methacrylate, 3-(glycidyl-2-oxyethoxy)-2-hydroxypropyl methacrylate, 3-(glycidyloxy-1-isopropyloxy)-2-hydroxypropyl acrylate, 3-(glycidyloxy-2-hydroxypropyloxy)-2-hydroxypropyl acrylate, and glycidyloxy polyethylene glycol methacrylate having an average molecular weight of 540 (the range of molecular weight from 390 to 660 is a main component). Among these, glycidyl acrylate, glycidyl methacrylate, and glycidyloxy polyethylene glycol methacrylate having an average molecular weight of 540 (the range of molecular weight from 390 to 660 is a main component) are particularly preferable.

When these epoxy-based monomers are contained, the blending ratio thereof in the radical polymerizable monomer is preferably 0.01 to 30% by mass, and particularly preferably 0.1 to 20% by mass.

In addition, the radical polymerizable monomer may contain a radical polymerizable monomer having a silanol group (≡Si—OH) or a group capable of generating a silanol group by being hydrolyzed (hereinafter, may be referred to as a silyl monomer) or a radical polymerizable monomer having an isocyanate group (hereinafter, may be referred to as an isocyanate monomer) in addition to the above-described monomers. By using a silyl monomer or an isocyanate monomer as a component of the radical polymerizable monomer, particularly when the lens base material is a plastic lens, the adhesion between the coating layer and the lens base material can be further increased, and when a hard coat layer is provided as an outer layer, the adhesion with the hard coat layer can also be increased.

Specific examples of the silyl monomer include γ-methacryloyloxypropyltrimethoxysilane, γ-methacryloyloxypropyltriethoxysilane, γ-methacryloyloxypropylmethyldimethoxysilane, (3-acryloxypropyl)dimethylmethoxysilane, (3-acryloxypropyl)methyldimethoxysilane, (3-acryloxypropyl)trimethoxysilane, 3-(N-allylamino)propyltrimethoxysilane, allyldimethoxysilane, allyltriethoxysilane, allyltrimethoxysilane, 3-aminophenoxydimethylvinylsilane, 4-aminophenoxydimethylvinylsilane, 3-(3-aminopropoxy)-3,3-dimethyl-1-propenyltrimethoxysilane, butenyltriethoxysilane, 2-(chloromethyl) allyltrimethoxysilane, diethoxyvinylsilane, 1,3-divinyltetraethoxydisiloxane, docosenyltriethoxysilane, O-(methacryloxyethyl)-N-(triethoxysilylpropyl)urethane, N-(3-methacryloxy-2-hydroxypropyl)-3-aminopropyltriethoxysilane, methacryloxyethoxytrimethylsilane, (methacryloxymethyl)dimethylethoxysilane, methacryloxymethyltriethoxysilane, methacryloxymethyltrimethoxysilane, methacryloxypropyldimethylethoxysilane, methacryloxypropyldimethylmethoxysilane, methacryloxypropyltris (methoxyethoxy)silane, 7-octenyltrimethoxysilane, 1,3-bis(methacryloxy)-2-trimethylsiloxypropane, tetrakis (2-methacryloxyethoxy)silane, trivinylethoxysilane, trivinylmethoxysilane, vinyldimethylethoxysilane, vinyldiphenylethoxysilane, vinylmethyldiacetoxysilane, vinylmethyldiethoxysilane, vinylmethyldimethoxysilane, O-(vinyloxyethyl)-N-(triethoxysilylpropyl) urethane, vinyloxytrimethylsilane, vinylphenyldiethoxysilane, vinylphenylmethylmethoxysilane, vinyltriacetoxysilane, vinyltri-t-butoxysilane, vinyltriethoxysilane, vinyltriisopropenoxysilane, vinyltriisopropoxysilane, vinyltrimethoxysilane, vinyltriphenoxysilane, and vinyltris(2-methoxyethoxy)silane Among these, γ-methacryloyloxypropyltrimethoxysilane, γ-methacryloyloxypropyltriethoxysilane, γ-methacryloyloxypropylmethyldimethoxysilane, (3-acryloxypropyl)dimethylmethoxysilane, (3-acryloxypropyl)methyldimethoxysilane, (3-acryloxypropyl)trimethoxysilane, (methacryloxymethyl)dimethylethoxysilane, methacryloxymethyltriethoxysilane, methacryloxymethyltrimethoxysilane, methacryloxypropyldimethylethoxysilane, and methacryloxypropyldimethylmethoxysilane can be particularly preferably used.

Specific examples of the isocyanate monomer that can be preferably used include 2-isocyanatoethoxymethacrylate and 4-(2-isocyanatoisopropyl)styrene.

When a silyl monomer or an isocyanate monomer is contained in the photochromic liquid, the blending amount of the silyl monomer or the isocyanate monomer is not particularly limited, but is preferably 0.5 to 20% by mass, and more preferably 1 to 10% by mass in the radical polymerizable monomer in order to achieve good adhesion to the lens base material or the hard coat layer and good scratch resistance when the hard coat layer is provided.

These silyl monomers or isocyanate monomers may be used alone or as a mixture of two or more thereof, and it is also possible to use a mixture of a silyl monomer and an isocyanate monomer.

(Other Blending Components; Amine Compound)

The photochromic liquid may separately contain an amine compound in addition to the radical polymerizable monomer. By using a photochromic liquid containing an amine compound, adhesion between a coating layer formed by curing and a lens base material can be improved.

As such an amine compound, a compound having an amino group can be used without any limitation. Specific examples of amine compounds that can be preferably used include non-polymerizable low molecular weight amine compounds such as triethanolamine, N-methyldiethanolamine, triisopropanolamine, 4,4-dimethylaminobenzophenone, and diazabicyclooctane; amine compounds having a polymerizable group such as N,N-dimethylaminoethyl methacrylate and N,N-diethylaminoethyl methacrylate; and amine compounds having a silyl group such as n-(hydroxyethyl)-N-methylaminopropyltrimethoxysilane, dimethoxyphenyl-2-piperidinoethoxysilane, N,N-diethylaminomethyltrimethylsilane, and (N,N-diethyl-3-aminopropyl)trimethoxysilane.

These amine compounds may be used alone or as a mixture of several kinds thereof. In a case where these amine compounds are contained, the blending amount thereof is preferably 0.1 to 20 parts by mass, more preferably 0.5 to 10 parts by mass, and still more preferably 1 to 10 parts by mass with respect to 100 parts by mass of the radical polymerizable monomer contained in the photochromic liquid. Within this range, high adhesion can be obtained.

(Polymerization Initiator)

The photopolymerization initiator (c) can be used without any limitation as long as it can be decomposed by irradiated light or the like to cure the polymerizable monomer (b).

Specific examples of the photopolymerization initiator include monoacylphosphine oxide-based compounds such as 2,6-dimethylbenzoyl diphenylphosphine oxide, 2,4,6-trimethylbenzoyldiphenylphosphine oxide, 2,6-dichlorobenzoyldiphenylphosphine oxide, and 2,6-dimethoxybenzoyldiphenylphosphine oxide; bisacylphosphine oxide-based compounds such as bis(2,6-dimethoxybenzoyl)-2,4,4-trimethylpentylphosphine oxide, bis(2,6-dimethylbenzoyl)-2,4,4-trimethylpentylphosphine oxide, bis(2,4,6-trimethylbenzoyl)-2,4,4-trimethylpentylphosphine oxide, bis(2,6-dichlorobenzoyl)-2,4,4-trimethylpentylphosphine oxide, bis(2,4,6-trimethylbenzoyl)-phenylphosphine oxide, and bis(2,4,6-trimethoxybenzoyl)-phenylphosphine oxide; benzophenol, acetophenone, 4,4'-dichlorobenzophenone, methylphenyl glyoxylate, thioxanthone, 2,4-dimethylthioxanthone, 2-methylthioxanthone, 2-chlorothioxanthone, diisopropylthioxanthone, 2,4-diethylthioxanthone, 2,4-dichlorothioxanthone, 2-isopropylthioxanthone, 3,3',4,4'-tetra(t-butylperoxycarbonyl) benzophenone, camphorquinone, dibenzosuberone, 2-ethylanthraquinone, 4',4"-diethylisophthalophenone, 9,10-phenanthrenequinone, 1-phenyl-1,2-propanedione-2-(O-ethoxycarbonyl)oxime, benzophenone, methyl orthobenzoylbenzoate, orthobenzoylbenzoic acid, 4-benzoyl-4'-methyldiphenyl sulfide, 2,2-dimethoxy-1,2-diphenylethan-1-one, 2-benzyl-2-dimethylamino-1-(4-morpholinophenyl)-butanone-1,2-methyl-1-[4-(methylthio)phenyl]-2-morpholinopropan-1-one, 1-hydroxy-cyclohexyl-phenyl-ketone, 1-[4-(2-hydroxyethoxy)-phenyl]-2-hydroxy-2-methyl-1-propan-1-one, 2-hydroxy-2-methyl-1-phenyl-propan-1-one, 4-phenylbenzophenone, hydroxybenzophenone, 3,3'-dimethyl-4-methoxybenzophenone, benzoin, benzoin methyl ether, benzoin ethyl ether, benzoin isopropyl ether, benzoin isobutyl ether, 4-phenoxydichloroacetophenone, 4-t-butyl-dichloroacetophenone, 4-t-butyl-trichloroacetophenone, diethoxyacetophenone, 1-(4-isopropylphenyl)-2-hydroxy-2-methylpropan-1-one, 1-(4-dodecylphenyl)-2-hydroxy-2-methylpropan-1-one, and 4-(2-hydroxyethoxy)-phenyl(2-hydroxy-2-propyl)ketone.

These photopolymerization initiators are generally used in a range of 0.001 to 5 parts by mass with respect to 100 parts by mass of the radical polymerizable monomer (b). The above-mentioned photopolymerization initiators may be used alone or in combination of two or more thereof.

The photochromic liquid may contain a thermal polymerization initiator in addition to the photopolymerization initiator, whereby the photochromic liquid can be cured by heating after or simultaneously with irradiation with light or the like.

The thermal polymerization initiator is not particularly limited, and known initiators can be used, and typical examples thereof include diacyl peroxides such as benzoyl peroxide, p-chlorobenzoyl peroxide, decanoyl peroxide, lauroyl peroxide, and acetyl peroxide; peroxyesters such as t-butylperoxy-2-ethylhexanoate, t-butylperoxydicarbonate, cumyl peroxyneodecanoate, and t-butylperoxybenzoate; percarbonates such as diisopropyl peroxydicarbonate, di-2-ethylhexyl peroxydicarbonate, and di-sec-butyloxy carbonate; and azo compounds such as 2,2'-azobisisobutyronitrile, 2,2'-azobis(4-dimethylvaleronitrile), 2,2'-azobis(2-methylbutyronitrile), and 1,1'-azobis(cyclohexane-1-carbonitrile).

The amount of the thermal polymerization initiator used varies depending on the curing conditions, the type of the initiator, and the type and composition of the radical-polymerizable monomer, and is not particularly limited. In general, the thermal polymerization initiator is preferably used in a range of 0.01 to 10 parts by mass with respect to 100 parts by mass of the radical-polymerizable monomer (b). These thermal polymerization initiators may be used alone or in combination of two or more thereof.

(Other Additive Components)

Additives such as surfactants, antioxidants, radical scavengers, ultraviolet stabilizers, ultraviolet absorbers, mold release agents, coloring inhibitors, antistatic agents, fluorescent dyes, dyes, pigments, perfumes, and plasticizers may be added to the photochromic liquid for the purpose of preventing yellowing of the coating layer (coat layer), improving moldability, improving durability of the photochromic compound when added, improving color development speed, improving fading speed, and the like, as long as the effects of the present invention are not impaired.

For example, as the surfactant, any of a nonionic surfactant, an anionic surfactant, and a cationic surfactant can be used, but it is preferable to use a nonionic surfactant from the viewpoint of solubility in a radical polymerizable monomer. Specific examples of nonionic surfactants that can be preferably used include sorbitan fatty acid esters, glycerin fatty acid esters, decaglycerin fatty acid esters, propylene glycol-pentaerythritol fatty acid esters, polyoxyethylene sorbitan fatty acid esters, polyoxyethylene sorbitol fatty acid esters, polyoxyethylene glycerin fatty acid esters, polyethylene glycol fatty acid esters, polyoxyethylene alkyl ethers, polyoxyethylene phytosterol/phytostanols, polyoxyethylene polyoxypropylene alkyl ethers, polyoxyethylene alkylphenyl ethers, polyoxyethylene castor oils/hydrogenated castor oils, polyoxyethylene lanolins/lanolin alcohols/beeswax derivatives, polyoxyethylene alkylamine fatty acid amides, polyoxyethylene alkylphenyl formaldehyde condensates, and single-chain polyoxyethylene alkyl ethers. The surfactant may be used in combination of two or more kinds thereof. The addition amount of the surfactant is preferably in a range of 0.1 to 20 parts by mass with respect to 100 parts by mass of the radical polymerizable monomer (b).

As the antioxidant, radical scavenger, ultraviolet stabilizer, and ultraviolet absorber, hindered amine light stabilizers, hindered phenol antioxidants, phenol-based radical scavengers, sulfur-based antioxidants, benzotriazole-based compounds, benzophenone-based compounds and the like can be preferably used. Two or more kinds of these antioxidants, radical scavengers, ultraviolet stabilizers, and ultraviolet absorbers may be mixed and used. When these non-polymerizable compounds are used, a surfactant and an antioxidant, a radical scavenger, an ultraviolet stabilizer and an ultraviolet absorber may be used in combination. The addition amount of each of the antioxidant, the radical scavenger, the ultraviolet stabilizer, and the ultraviolet absorber is preferably in a range of 0.001 to 20 parts by mass with respect to 100 parts by mass of the polymerizable monomer (b).

In the photochromic curable composition according to the present invention, the viscosity (at 25° C.) is preferably adjusted to 20 to 5000 mPa·s, more preferably to 50 to 1000 mPa·s, still more preferably to 70 to 500 mPa·s or less, and particularly preferably to 100 to 300 mPa·s by blending and mixing the above-mentioned components.

(Spreading Step and First Removal Step; Case where Coating Agent Serving as Functional Layer is Used)

In the present invention, the coating agent constituting the functional layer may be supplied to the surface of the lens base material and spread by a known method, that is, spread using a spin coating method. Among these, when a coating agent composed of a photochromic curable composition is used, the following method can be employed.

First, the photochromic curable composition is supplied to the center portion on the primer coat layer of the primer coat lens base material, and the lens base material is rotated at a rotational speed of 10 to 500 rpm, more preferably 30 to 300 rpm, and still more preferably 50 to 200 rpm. At this time, it is also possible to spread the photochromic curable composition using a coating liquid spreading assisting mechanism made of a resin film such as polypropylene or polyethylene terephthalate. The time required for spreading may be appropriately determined in consideration of the rotational speed of the lens base material, the size of the lens base material, and the like. Above all, in consideration of operability, the thickness of the obtained photochromic layer, and the like, the time required for spreading is preferably 5 to 120 seconds (sec.), and more preferably 10 to 60 seconds (sec.).

Next, it is preferable to perform a first removal step (a step of removing at least a part of a liquid pool generated by spreading by rotation of the lens base material). In the first removal step, it is preferable to remove at least a part of the liquid pool by setting the rotational speed of the lens base material to be greater than 500 rpm and equal to or less than 2000 rpm. In consideration of the operability and the efficiency of removing the liquid pool, it is preferable to perform the first removal step with the rotational speed of the lens base material being greater than 500 rpm and equal to or less than 1500 rpm, and it is further preferable to perform the first removal step with the rotational speed of the lens base material being 600 to 1300 rpm. The time for performing the first removal step is not particularly limited, but is preferably 1 to 60 seconds (sec.), more preferably 1 to 30 seconds (sec.), and still more preferably 1 to 10 seconds (sec.) in order to efficiently remove the liquid pool.

When a coating agent for forming a functional layer is used, after the first removal step is performed, a second removal step can be performed. After the first removal step, a spatula may be brought into contact with the side surface of the lens base material to further remove an excess liquid pool, and then the second removal step may be performed. By providing the step of bringing the spatula into contact with the lens base material, in the case of forming a functional layer, it is easy to form a coat layer (produce a coated lens) on a lens base material having a large base curve on which it is difficult to form a high-quality coat layer. In particular, in the case of forming a coat layer having a base curve of 4 or more on the surface of the lens base material, it is preferable to provide the step of bringing the spatula into contact with the lens base material. The step of contacting the spatula after the first removal step (spatula contacting step) will be described.

<Spatula Contacting Step; in Particular, Case of Forming Functional Layer>

As described above, when the functional layer is formed, a spatula may be brought into contact with the side surface of the lens base material in the latter half of the first removal step or after the first removal step (preferably after the first removal step) to further remove an excess liquid pool. This spatula contacting step is not essential, but can be suitably employed particularly when forming a coat layer having a base curve of 4 or more, preferably 5 or more, and more preferably 5 to 15 on the surface of the lens base material. That is, it is desirable to remove the excess coating liquid with a spatula before performing the contact treatment of the adsorption member.

The material and shape of the spatula to be used are not particularly limited. For example, a spatula made of metal, plastic such as polyethylene terephthalate (PTFE), or rubber such as silicon can be used. The shape may be close to the side surface of the lens base material, and is preferably a shape in which a portion in contact with the side surface of the lens base material is linear. As a matter of course, even if the spatula contacting step is applied to a lens base material having a base curve of less than 4, a high-quality coated lens can be produced.

When the thickness of the spatula in contact with the side surface of the lens base material (thickness of the tip of the spatula) is thick (when the contact area is large), the shape of the liquid pool in the peripheral portion may be large. In particular, in the case of a lens base material having a high curve and a thin side surface, there is a high tendency that the liquid pool becomes large. In particular, this tendency increases when the base curve of the surface of the lens base material is 5 or more. In order to efficiently remove the excess coating liquid and reduce the liquid accumulation in the peripheral portion, it is preferable that the thickness of the spatula tip portion that comes into contact with the side surface of the lens base material is in the following range. That is, the thickness of the tip of the spatula that comes into contact with the side surface of the lens base material is preferably 0.05 to 2 mm, and more preferably 0.1 to 1 mm.

In addition, the spatula tip is preferably linear, but the shape of the spatula tip is preferably an acute angle. That is, when the spatula is viewed in a plane perpendicular to the side surface of the lens base material, an angle formed by both side surfaces of the spatula with the tip of the spatula as an apex (apex angle; hereinafter, may be referred to as "blade edge angle") is preferably 5° or more and less than 90°. When the thickness of the spatula tip is within the above range and the blade edge angle satisfies the above range, a particularly excellent effect is exhibited. In order to form a higher-quality coat layer, the blade edge angle is preferably 10° or more and 45° or less, more preferably 10° or more and 30° or less, and still more preferably 10° or more and 25° or less.

In the spatula used in the present invention, it is preferable that the thickness of the tip satisfies the above-described range and the blade edge angle satisfies the above-described range, but it is preferable that the spatula has a portion where the side surfaces of the spatula face each other (parallel to each other) in a portion where the angle is not an acute angle (a portion other than the tip portion). The thicknesses of the portions where the spatula side surfaces are parallel to each other are not particularly limited, but are preferably about 2 mm or more and 5 mm or less in consideration of the processability of the spatula tip, the strength of the spatula, and the like.

It is preferable to use a spatula having a shape as described above, particularly having a tip portion. The spatula is preferably disposed so that the tip of the spatula comes into contact with the entire side surface of the lens base material.

When the spatula is brought into contact with the lens base material, it is preferable that the spatula is brought into contact with the side surface of the lens base material in a rotated state. Among these, in the case of forming a functional layer, particularly in the case of using a photochromic curable composition, it is preferable to bring the tip of the spatula into contact with the side surface under the following conditions. To be specific, in order to stably remove the liquid pool, the pressing load (contact force) is preferably 5 to 200 g, and more preferably 30 to 150 g. By setting the contact force in this range, the liquid pool can be efficiently removed by the spatula. When the spatula is brought into contact, the force of the spring may be used in the same manner as described in "(Suitable Contact Conditions of Adsorption Member; Case where Primer Composition is Used)".

In addition, the rotational speed of the lens base material when the spatula is brought into contact with the lens base material is preferably from 5 rpm to 500 rpm. By setting the rotational speed to 5 rpm or more, production efficiency does not decrease. In addition, by setting the rotational speed to 500 rpm or less, the efficiency of removing the coating agent from the peripheral edge portion of the lens base material is stabilized, and a uniform coating film can be obtained. In order to further enhance such an effect, the rotational speed is preferably 10 to 100 rpm, and in order to more stably remove the liquid pool, the rotational speed is preferably 20 to 70 rpm. The contact time of the spatula is preferably 0.5 to 30 seconds, and more preferably 1 to 10 seconds. If the contact time of the spatula is too short, the liquid pool may not be sufficiently removed, and if the contact time of the spatula is too long, a new liquid pool may be formed during adsorption, and the production efficiency is also reduced.

Next, a second removal step is performed.

(Second Removal Step; Case where Coating Agent for Forming Functional Layer is Used)

In the present invention, also in the case of forming the functional layer, the second removal step is performed after the first removal step. Basically, an operation equivalent to that described in the above "(Second Removal Step; Case where Primer Composition is Used)" may be performed. However, suitable conditions may be different, and this will be mainly described.

(Second Removal Step; Case where Coating Agent for Forming Adsorption Member/Functional Layer is Used)

In the present invention, even in the case of forming a functional layer, the adsorption member described in the above "(Second Removal Step; Case where Adsorption Member/Primer Composition is Used)" can be used without any limitation. That is, the same materials and characteristics (hardness) as those described above can be used. In particular, it is preferable to use a sponge as in the case of forming the primer coat layer. As for the characteristics of the sponge, it is preferable to use a sponge having a density and a pore diameter in the same ranges as described above. Therefore, examples of such a sponge include "Basotect" (registered trademark) series sold by Inoac Corporation.

When a functional layer is formed, particularly when a coating agent composed of a photochromic curable composition is used, it is preferable to use a sponge containing an organic solvent. Next, the adsorption member (sponge) containing an organic solvent will be described.

(Second Removal Step; Case where Coating Agent for Forming Adsorption Member Containing Organic Solvent/Functional Layer is Used)

In the present invention, when a functional layer is formed, particularly when a coating agent composed of a photochromic curable composition is used, it is preferable to use the adsorption member, particularly a sponge containing an organic solvent.

The type of organic solvent used is preferably one that can be mixed with the coating agent. Specifically, the same solvents as described above are preferably used, and examples thereof include alcohol solvents, ketone-based solvents, aromatic solvents, halogen-based solvents, and ester-based solvents. Among them, ketone-based solvents are preferably used in consideration of ease of handling, influence on the human body, and effect of removing the liquid pool, and acetone, methyl ethyl ketone, and methyl isobutyl ketone are most preferably used.

In the case of forming the functional layer, the curing method is often different from that of the primer composition, and since the viscosity is different, when an organic solvent is used, the amount thereof is preferably within the following range. To be specific, the amount of the organic solvent contained in the sponge is preferably adjusted so that 0.1 to 2 g of the organic solvent is contained per 1 cm$^3$ volume of the sponge. By containing the organic solvent in this range, it is possible to efficiently and stably remove the liquid pool.

Even in the case where the functional layer is formed, the shape of the adsorption member is not particularly limited, and the removal of the liquid pool by the adsorption member is preferably performed by bringing the adsorption member into contact with at least the side surface (edge surface) of the lens base material while rotating the lens base material. By being brought into contact with the side surface, the liquid pool in the peripheral edge portion of the lens base material can be easily removed.

(Suitable Arrangement of Adsorption Member; Case where Coating Agent for Forming Functional Layer is Used)

When a functional layer is formed, the thickness of the functional layer is often larger than that of the primer coat layer. Therefore, it is preferable to remove the liquid pool by disposing an adsorption member at the following position. In particular, when the photochromic curable composition is used as the coating agent, the adsorption member is preferably disposed at the following position.

Specifically, it is preferable to dispose the adsorption member so that the adsorption member (sponge) comes into contact with the entire surface of the side surface of the lens base material. In addition, it is preferable that the length of the surface in contact with the adsorption member (sponge) is longer in the vertical direction than the length of the side surface of the lens base material. In the case of forming the functional layer, in particular, the photochromic coat layer, in order to efficiently remove the liquid pool, a sponge larger than the side surface of the lens base material in the vertical direction is brought into contact with the lens base material so that the liquid pool can be efficiently removed.

(Suitable Shape and Contact Condition of Adsorption Member; Case where Coating Agent for Forming Functional Layer is Used)

Even in the case of forming the functional layer, it is preferable that the adsorption member is brought into contact with the side surface of the lens base material while rotating the lens base material, that is, it is preferable that the adsorption member has a cylindrical shape, and it is preferable that a side wall surface of the cylindrical shape serves as a contact portion. Since the shape of the lens base material is not different from that in the case of forming the primer coat layer, the suitable shape of the adsorption member is preferably the same shape or the like. Specifically, it is preferable that the adsorption member has a structure that is rotatable about a cylindrical center axis (central axis of the cylinder), and a roller in which the periphery of a rotating shaft that rotates is covered with an adsorption member (a roller in which a rotating shaft is installed in a hollow portion of an adsorption member that is hollow) is used. Furthermore, in this case, the rotating shaft preferably has a diameter of 10 to 50 mm, and the adsorption member preferably has a thickness of 2 to 50 mm (the thickness of the adsorption member at the portion covering the rotating shaft), more preferably 2 to 45 mm, and particularly preferably 5 to 30 mm. In this case, the height of the adsorption member is preferably 5 to 50 mm, more preferably 10 to 40 mm, and the adsorption member is preferably present above and below the side surface of the lens base material.

The adsorption member having this shape can be used for removing liquid pools from a plurality of lens base materials. The coated lens can be repeatedly used a plurality of times as long as the quality of the obtained coated lens can be maintained. However, in order to stably obtain a high-quality coated lens, it is preferable to adjust the adsorption member to be in the same state every time. As the adjusting method, the same method as described above in "(Preferred Embodiment of Adsorption Member; Case where Primer Composition is Used)" can be adopted.

(Preferred Embodiment of Adsorption Member; Case where Coating Agent for Forming Functional Layer is Used)

Even in the case of forming the functional layer, it is preferable to use the above-described sponge, and it is further preferable that the sponge contains an organic solvent. In particular, when a coating agent composed of a photochromic curable composition is used, it is preferable to use a sponge containing an organic solvent. Among them, when an organic solvent is used, it is preferable to use a ketone-based solvent, and the amount thereof is preferably 0.1 to 2 g, preferably 0.1 to 1 g, and more preferably 0.2 to 0.7 g per 1 cm$^3$ of the sponge as described above.

Even when the functional layer is formed, a plurality of lens base materials can be treated as long as the amount of the organic solvent falls within the above range. However, in order to obtain a higher quality coated lens, it is preferable to adjust the amount of the organic solvent to fall within the above range each time.

(Suitable Contact Conditions of Adsorption Member; Case where Coating Agent for Forming Functional Layer is Used)

As described above, the adsorption member is preferably in contact with the side surface of the lens base material in a rotated state. Among these, in the case of forming a functional layer, particularly in the case of using a photochromic curable composition, it is preferable to bring the adsorption member into contact with the side surface under the following conditions. To be specific, in order to stably remove the liquid pool, the pressing load (contact force) is preferably 5 to 200 g, and more preferably 5 to 100 g. By setting the contact force in this range, it can be assumed that the sponge comes into close contact with the side surface and the sponge is present above and below the side surface, and thus the liquid pool in the peripheral edge portion of the lens base material can be efficiently removed.

The rotational speed of the lens base material at the time of contact is preferably 5 rpm to 500 rpm. When the rotational speed is 5 rpm or more, the adsorption removal does not take time and the production efficiency does not decrease. In addition, by setting the rotational speed to 500 rpm or less, the efficiency of removing the coating agent from the peripheral edge portion of the lens base material is stabilized, and a uniform coating film can be obtained. In order to further enhance such an effect, the rotational speed is preferably 10 to 100 rpm, and in order to more stably remove the liquid pool, the rotational speed is preferably 20 to 70 rpm. The contact time is preferably 0.5 to 30 seconds, and more preferably 1 to 10 seconds. If the adsorption time is too short, the liquid pool may not be sufficiently removed, and if the adsorption time is too long, a new liquid pool may be formed during adsorption, and the production efficiency is also reduced.

When the adsorption member is brought into contact with the side surface of the lens base material, the spatula can also be brought into contact therewith at the same time. However, in order to more stably form a high-quality coat layer, it is preferable to contact only the adsorption member. Therefore, it is preferable to perform the first removal step and the second removal step in which the spatula is not brought into contact. Furthermore, in the case where a coat layer is formed on a lens base material having a large base curve, for example, a lens base material having a base curve of 4 or more, which is considered to be difficult to form a high-quality coat layer, it is preferable to remove the liquid pool in the order of the first removal step, the spatula contact under the above conditions, and the second removal step (no spatula contact).

(Coat Layer, Method of Forming Coat Layer: Case where Coating Agent that Forms Functional Layer is Used)

In the present invention, when a functional layer is formed, particularly when a photochromic curable composition is used, a photochromic coat layer is preferably formed by the following method. That is, after the above-described steps, the lens base material from which the liquid pool in the peripheral edge portion of the lens base material has been removed is usually irradiated with light such as ultraviolet rays and/or heated for a predetermined time in a nitrogen atmosphere to cure the spread coating agent, thereby forming a coating layer.

In the case where a coating agent, for example, a photochromic curable composition contains a photopolymerization initiator as a radical polymerization initiator, curing can be performed by irradiation with ultraviolet rays, α-rays, β-rays, γ-rays, or the like, or by a combination of the irradiation and heating. In the case where curing is performed by irradiation with ultraviolet rays, as a light source, an ultrahigh pressure mercury lamp, a high pressure mercury lamp, a low pressure mercury lamp, a xenon lamp, a carbon arc, a germicidal lamp, a metal halide lamp, an electrodeless lamp, an LED lamp, or the like can be used. In particular, in the case where an LED lamp is used and a polymerizable monomer is contained, excessive heat generation is less likely to occur, and thus the viscosity during curing does not become too high, and the formation of the liquid pool may become more significant. The present invention can be suitably applied to a case where such an LED lamp is used.

As described above, according to the coating method of the present invention, since the step of supplying the coating agent, the spreading step, the first removal step, and the second removal step are included, it is possible to suitably remove the liquid pool formed on the peripheral edge portion and/or the side surface portion of the lens base material during spreading.

EXAMPLES

Figure 2:
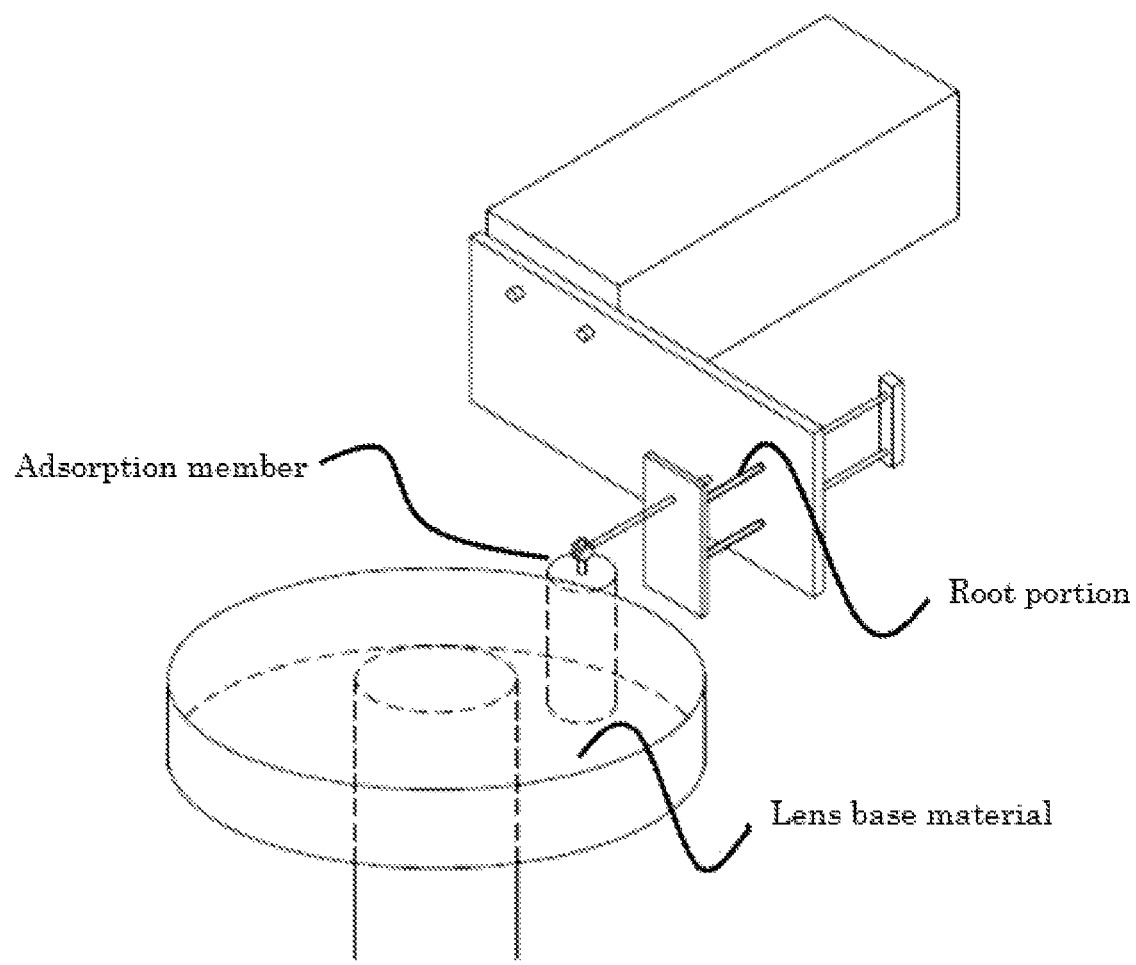
FIG. 2 is a view showing another example using an adsorption member according to the present invention.
Figure 3:
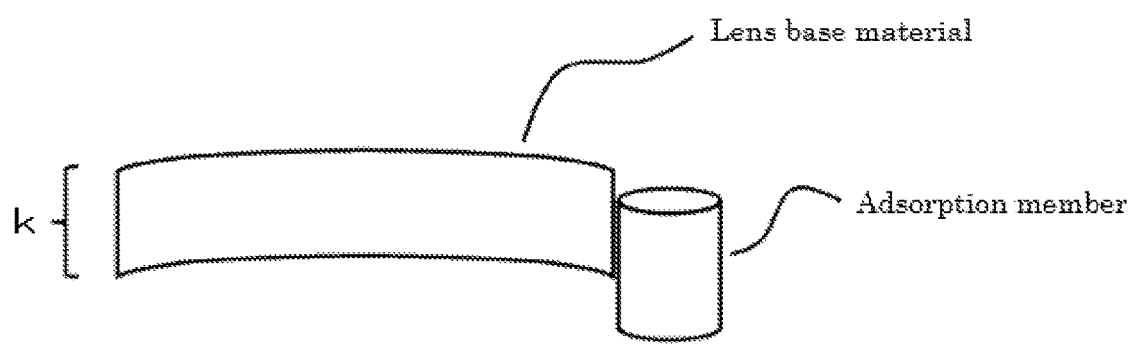
FIG. 3 is a schematic view showing a contact method of an adsorption member when a primer composition is used.

Hereinafter, the present invention will be described in more detail with reference to Examples, but the present invention is not limited to these Examples. It should be noted that FIG. 1, FIG. 2, and FIG. 3 show schematic views of apparatuses that can be used in the method of the present invention, but these scales do not necessarily coincide with actual scales. FIG. 1, FIG. 2, and FIG. 3 are schematic views for explaining the present invention, and do not faithfully reproduce the size.

(Evaluation of Width of Liquid Pool)

In any case using a coating agent composed of a primer composition and using a coating agent composed of a photochromic curable composition, evaluation was performed as follows.

An obtained lens was cut along a plane passing through the center of the lens surface and perpendicular to the lens surface using a diamond cutter, and the cross section of the primer coat layer or the photochromic coat layer was observed with a video microscope. The thickness of the primer coat layer or the photochromic coat layer in the vicinity of the center of the lens was measured from the observation image, while the thickness of the primer coat layer or the photochromic coat layer at the peripheral edge portion of the lens was also measured in the same manner, and the distance from the boundary portion where the difference in the thickness of the peripheral edge portion of the lens with respect to the thickness of the central portion of the lens was 10% or more to the lens end portion was defined as the width of the remaining portion of the liquid pool having a non-uniform thickness. When the width of the remaining portion was 2 mm or less, it was good, and when it was 3 mm or more, it was judged to be poor.

(Evaluation of Wrinkles in Liquid Pool)

In any case using a coating agent composed of a primer composition and using a coating agent composed of a photochromic curable composition, evaluation was performed as follows.

An obtained lens (lens having a coating layer) was allowed to transmit light of a fluorescent lamp in a black box, and occurrence of wrinkles due to shrinkage unevenness of the peripheral edge portion of the lens was visually confirmed. When shrinkage unevenness occurs, a wrinkle-like defect occurs in the peripheral edge portion. A case where wrinkles did not occur was evaluated as good, and a case where wrinkles occurred was evaluated as poor.

(Confirmation of Yield)

In any case using a coating agent composed of a primer composition and using a coating agent composed of a photochromic curable composition, evaluation was also performed as follows.

Twenty lenses were coated. The side surface of the obtained lens was checked to confirm whether or not a cured product was present in the vicinity of the side surface, and the yield of a lens having no cured product was determined.

(Each Component of Coating Agent that Forms Functional Layer (Hereinafter Also Referred to as Photochromic Liquid)

(a) Photochromic Compound

Photochromic compound PC1: 2 parts by mass

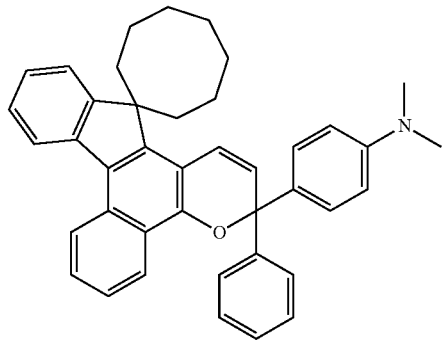

PC1

(b) Polymerizable Monomer (Radical Polymerizable Monomer)

Trimethylolpropane trimethacrylate: 30 parts by mass 2,2-bis[4-(methacryloxy polyethoxy)phenyl]propane (average chain length of ethylene glycol chain is 10, average molecular weight is 804): 45 parts by mass Polyethylene glycol diacrylate (average chain length of ethylene glycol chain is 9, average molecular weight is 508, (meth)acrylic equivalent: 254): 18 parts by mass Polyethylene glycol dimethacrylate (average chain length of ethylene glycol chain is 14, average molecular weight is 736): 5 parts by mass Glycidyl methacrylate: 1 part by mass (c) Photopolymerization Initiator Phenylbis(2,4,6-trimethylbenzoyl)-phosphine oxide (trade name: Irgacure 819, manufactured by BASF): 0.3 parts by mass (d) Other Components <Stabilizer>

Bis(1,2,2,6,6-pentamethyl-4-piperidyl) sebacate (molecular weight 508): 5 parts by mass Ethylenebis(oxyethylene) bis[3-(5-tert-butyl-4-hydroxy-m-tolyl)propionate](manufactured by Ciba Specialty Chemicals Inc., Irganox 245): 3 parts by mass <Silane Coupling Agent>

3-trimethoxysilylpropyl methacrylate: 6 parts by mass

<Leveling Agent>

L7001 manufactured by Dow Corning Toray Co., Ltd.: 0.1 parts by mass (Preparation of photochromic liquid)

The above components were stirred and mixed at 70° C. for 30 minutes to obtain a photochromic liquid. The kinematic viscosity of the photochromic liquid was measured using a Cannon-Fenske viscometer. The kinematic viscosity was measured at 25° C. in accordance with JIS K2283. From the obtained kinematic viscosity and the specific gravity of the sample measured in advance, the viscosity of the sample was calculated using the formula [viscosity (mPa·s)=kinematic viscosity (cSt)×specific gravity (g/cm$^3$)] and was found to be 110 mPa·s.

<Coating Agent Composed of Primer Composition>

Moisture-curable primer composition 1 (product name: TR-SC-P, manufactured by Tokuyama Corporation); a primer composition containing moisture-curable urethane.

Moisture-curable primer composition 2; a primer composition containing 25% by mass (solid content) of moisture-curable urethane and 75% by mass of ethyl acetate.

Example 1

The moisture-curable primer composition 1 was spin-coated on the surface of a thiourethane-based plastic lens (diameter 70 mm, surface base curve: 5.00) having a refractive index of 1.60 at a rotational speed of 250 rpm for 6 seconds and then at 1500 rpm for 5 seconds, and dried at room temperature for 10 minutes to obtain a lens base material having s primer coat layer. The thickness of the resulting primer coat layer was adjusted to be between 6.5 and 7.5 µm. As the lens base material used in the next step, a lens base material in which a cured product was not adhered to the side surface of the lens base material was selected.

Next, 2 g of the photochromic liquid obtained as described above was supplied onto the lens base material on which the primer coat layer was formed, and the photochromic liquid was spread by rotating and holding at a rotational speed of 100 rpm for 30 seconds. Subsequently, the lens base material was rotated and held at a rotational speed of 900 rpm for 6 seconds, and excess photochromic liquid was shaken off.

Next, the rotational speed was reduced to 50 rpm, and while maintaining the rotation, a cylindrical-shaped adsorption member having a diameter of 3 cm and a length of 7 cm was brought into close contact with the peripheral edge portion of the lens base material, and the photochromic liquid was adsorbed and removed during 5 seconds. At this time, the material of the adsorption member used was open-cell type foamed polyurethane, and had a hardness of 320 N. The ambient temperature during spin coating of the photochromic liquid and during removal by adsorption was about 22° C.

The lens base material on which the photochromic liquid was spread on the surface in this way was irradiated with light for 90 seconds using a metal halide lamp having an output of 200 mW/cm$^2$ under a nitrogen atmosphere to cure the photochromic liquid. Thereafter, the resultant was heated at 90° C. for 1 hour to obtain a lens having a coating layer. The width of the liquid pool remaining portion of the obtained lens was 1.5 mm, which was good, and wrinkles due to shrinkage unevenness caused by curing did not occur.

Example 2

A lens having a coating layer was produced in the same manner as in Example 1, except that an LED lamp having an output of 400 mW/cm$^2$ (peak wave length 385 nm, emission peak half-width 10 nm) was used as a light source for photocuring, and light was irradiated for 40 seconds. The width of the liquid pool remaining portion of the obtained lens was 1.5 mm, which was good, and wrinkles due to shrinkage unevenness caused by curing did not occur.

Comparative Example 1

A lens having a coating layer was produced in the same manner as in Example 1, except that adsorption and removal by an adsorption member were not performed after the photochromic liquid was spin-coated. The width of the liquid pool remaining portion of the obtained lens was 3.5 mm, which was poor, but wrinkles due to shrinkage unevenness caused by curing did not occur.

Comparative Example 2

A lens having a coating layer was produced in the same manner as in Example 2, except that adsorption and removal by an adsorption member were not performed after the photochromic liquid was spin-coated. The width of the liquid pool remaining portion of the obtained lens was 3.5 mm, which was poor, and a wrinkle defect occurred in the peripheral edge portion.

As described above, in the Examples, the region having a non-uniform thickness formed in the peripheral edge portion of the lens is narrow, and it was confirmed that a lens having a more uniform coating layer can be formed by a coating method in which adsorption and removal are performed by an adsorption member.

Example 3

The moisture-curable primer composition 2 was applied to the surface of a thiourethane-based plastic lens base material having a refractive index of 1.60 (finish lens having a diameter of 70 mm, surface base curve of 1.0, and width of side surface (thickness of side surface) of 8.9 mm), and the moisture-curable primer composition 2 was spread by spin coating at a rotational speed of 250 rpm for 6 seconds. (First Removal Step)

Subsequently, coating was performed at 1500 rpm for 5 seconds, and at least a part of the liquid pool was removed.

(Second Removal Step)

A sponge (adsorption member) made of melamine resin having a density of 9.2 kg/m³ and a pore diameter of 50 to 400 μm was prepared. To be specific, a roller covered with an adsorption member having a thickness of 20 mm and a height of 30 mm was prepared around a rotatable rotating shaft. (A hollow sponge having a cylindrical center portion serving as a rotating shaft was prepared. The hollow sponge had a volume of 38 cm³ and a hardness of 320 N.) The sponge was impregnated with acetone at 0.7 g per 1 cm³ of the sponge.

The sponge was disposed such that the uppermost position of the sponge was in contact with a position 1.5 mm below the uppermost position of the side surface of the lens base material obtained through the first removal step. (The sponge was brought into contact with the entire surface of the lower side surface from the position with which the uppermost position of the sponge was in contact. See FIG. 3.) Note that FIG. 2 is a schematic view showing the second removal step for forming the primer coat layer.

While the sponge containing acetone was brought into contact with the side surface in the above-described state with a contact force of 60 g, the lens base material to which the primer composition had been applied was rotated at 80 rpm for 5 seconds, thereby removing the liquid pool and the cured product.

The above-described steps were carried out under the same conditions to prepare 20 lens base materials each having a primer coat layer, and the yield was confirmed. In addition, the state of the peripheral edge portion of the lens base material was evaluated in accordance with "(Evaluation of Width of Liquid Pool)" and "(Evaluation of Wrinkles in Liquid Pool)". The conditions are summarized in Table 1, and the evaluation results are summarized in Table 2.

Examples 4 to 21

Lens base materials each having a primer coat layer were produced in the same manner as in Example 3, except that the type of the lens base materials and the conditions of the second removal step shown in Table 1 were employed. The conditions are summarized in Table 1, and the evaluation results are summarized in Table 2.

Comparative Example 3

A lens base material having a primer coat layer was produced in the same manner as in Example 3, except that the second removal step was not performed. The conditions are summarized in Table 1, and the evaluation results are summarized in Table 2.

TABLE 1

| | Lens base material | | | First removal step | | Primer coat layer — Second removal step | | | | | |
|---|---|---|---|---|---|---|---|---|---|---|---|
| | Refractive index | Diameter (mm) | Surface base Curve | Edge surface width (mm) | Rotational speed (rpm) | Time (sec) | Adsorption member material | Adsorption member density (kg/m³) | Organic solvent amount (g/cm³) | Rotational speed (rpm) | Time (sec) | Contact force (g) |
| Example 3 | 1.6 | 70 | 1 | 8.9 | 1500 | 5 | Melamine resin | 9.2 | 0.7 | 80 | 5 | 60 |
| Example 4 | | 70 | 1 | 8.9 | 1500 | 5 | | 9.2 | 0.3 | 80 | 5 | 60 |
| Example 5 | | 70 | 1 | 8.9 | 1500 | 5 | | 9.2 | 0.1 | 80 | 5 | 60 |
| Example 6 | | 70 | 1 | 8.9 | 1500 | 5 | | 9.2 | 1.2 | 80 | 5 | 60 |
| Example 7 | | 70 | 1 | 8.9 | 1500 | 5 | | 9.2 | 0.7 | 80 | 5 | 30 |
| Example 8 | | 70 | 1 | 8.9 | 1500 | 5 | | 9.2 | 0.7 | 80 | 5 | 10 |
| Example 9 | | 70 | 1 | 8.9 | 1500 | 5 | | 9.2 | 0.7 | 80 | 5 | 120 |
| Example 10 | | 70 | 1 | 8.9 | 1500 | 5 | | 9.2 | 0.7 | 80 | 5 | 180 |
| Example 11 | | 75 | 3 | 3.8 | 1500 | 5 | | 9.2 | 0.7 | 80 | 5 | 60 |
| Example 12 | | 75 | 2 | 6.6 | 1500 | 5 | | 9.2 | 0.7 | 80 | 5 | 60 |
| Example 13 | | 70 | 0.5 | 13 | 1500 | 5 | | 9.2 | 0.7 | 80 | 5 | 60 |
| Example 14 | | 65 | 4.75 | 1.2 | 1500 | 5 | | 9.2 | 0.7 | 80 | 5 | 60 |
| Example 15 | | 65 | 6 | 1 | 1500 | 5 | | 9.2 | 0.7 | 80 | 5 | 60 |
| Example 16 | | 70 | 1 | 8.9 | 1500 | 5 | | 5.6 | 0.7 | 80 | 5 | 60 |
| Example 17 | | 70 | 1 | 8.9 | 1500 | 5 | | 9.2 | 0.7 | 20 | 10 | 60 |
| Example 18 | | 70 | 1 | 8.9 | 1500 | 5 | | 9.2 | 0.7 | 40 | 10 | 60 |
| Example 19 | | 70 | 1 | 8.9 | 1500 | 5 | | 9.2 | 0.7 | 150 | 5 | 60 |
| Example 20 | | 70 | 1 | 8.9 | 1500 | 5 | Urethane resin | 45.6 | 0.7 | 80 | 5 | 60 |
| Example 21 | | 70 | 1 | 8.9 | 1500 | 5 | | 12 | 0.7 | 80 | 5 | 60 |
| Comparative Example 3 | | 70 | 1 | 8.9 | 1500 | 5 | | — | | | | |

The spreading of the moisture-curable primer composition 2, the first removal step, and the second removal step were performed in a state where the humidity was 60% RH and the temperature was 23° C.

(Formation and Hardening of Primer Coat Layer)

The lens base material obtained through the second removal step was dried at room temperature for 10 minutes to obtain a lens base material having a primer coat layer. The thickness of the resulting primer coat layer was adjusted to be between 6.5 and 7.5 μm.

TABLE 2

| | Evaluation | | |
|---|---|---|---|
| | Liquid pool width (mm) | Liquid pool wrinkles | Edge surface yield (%) |
| Example 3 | <1 mm | Good | 100 |
| Example 4 | <1 mm | Good | 90 |
| Example 5 | <1 mm | Good | 60 |
| Example 6 | <1 mm | Good | 70 |

TABLE 2-continued

|  | Evaluation | | |
| --- | --- | --- | --- |
|  | Liquid pool width (mm) | Liquid pool wrinkles | Edge surface yield (%) |
| Example 7 | <1 mm | Good | 80 |
| Example 8 | <1 mm | Good | 30 |
| Example 9 | <1 mm | Good | 90 |
| Example 10 | <1 mm | Good | 70 |
| Example 11 | <1 mm | Good | 100 |
| Example 12 | <1 mm | Good | 100 |
| Example 13 | <1 mm | Good | 100 |
| Example 14 | <1 mm | Good | 90 |
| Example 15 | <1 mm | Good | 90 |
| Example 16 | <1 mm | Good | 80 |
| Example 17 | <1 mm | Good | 40 |
| Example 18 | <1 mm | Good | 60 |
| Example 19 | <1 mm | Good | 70 |
| Example 20 | <1 mm | Good | 50 |
| Example 21 | <1 mm | Good | 70 |
| Comparative Example 3 | <1 mm | Good | 10 |

Example 22 (Formation of Photochromic Coat Layer)

A lens base material having the primer coat layer obtained in Example 3 on the surface thereof was used. 2 g of the photochromic liquid obtained as described above was supplied onto the primer coat layer of the lens base material, and the photochromic liquid was spread by rotating and holding at a rotational speed of 100 rpm for 30 seconds.

(First Removal Step)

Subsequently, the lens base material was rotated and held at a rotational speed of 900 rpm for 6 seconds, and at least a part of the excess photochromic liquid was shaken off.

(Second Removal Step)

A sponge (adsorption member) made of melamine resin having a density of 9.2 kg/m$^3$ and a pore diameter of 50 to 400 μm was prepared. To be specific, a roller covered with an adsorption member having a thickness of 20 mm and a height of 30 mm was prepared around a rotatable rotating shaft. (A hollow sponge having a cylindrical center portion serving as a rotating shaft was prepared. The hollow sponge had a volume of 38 cm$^3$ and a hardness of 320 N.) The sponge was impregnated with acetone at 0.4 g per 1 cm$^3$ of the sponge.

The sponge was disposed so as to be in contact with the entire surface of the side surface of the lens base material obtained through the first removal step. (The uppermost position of the sponge was located above 0.5 mm from the uppermost position of the side surface of the lens base material, and the lowermost position of the sponge was located below 1.6 mm from the lowermost position of the side surface.)

While the sponge containing acetone was brought into contact with the side surface in the above-described state with a contact force of 25 g, the lens base material to which the photochromic liquid had been applied was rotated at 30 rpm for 2 seconds, thereby removing the liquid pool.

The spreading of the photochromic liquid, the first removal step, and the second removal step were performed in an atmosphere having a humidity of 60% RH and a temperature of 23° C.

(Formation and Hardening of Photochromic Coat Layer)

A lens having a coating layer was produced in the same manner as in Example 1, except that an LED lamp having an output of 400 mW/cm$^2$ (peak wave length 385 nm, emission peak half-width 10 nm) was used as a light source for photocuring, and light was irradiated for 40 seconds. The photochromic coat layer had a thickness of 40 μm.

The width of the liquid pool remaining portion of the obtained lens was less than 1 mm, which was good, and wrinkles due to shrinkage unevenness caused by curing did not occur. In addition, no cured product adhered to the side surface.

The above-described steps were carried out under the same conditions to produce 20 lenses each having a photochromic coat layer. Table 4 shows the average value of the width of the remaining portion of the liquid pool for 20 lenses. The evaluation of the occurrence of wrinkles is shown in Table 4. There were no cured products adhering to the side surfaces of the 20 lenses.

The above conditions are summarized in Table 3, and the results are summarized in Table 4.

Examples 23 to 36

Lens base materials each having a photochromic coat layer were produced in the same manner as in Example 22, except that the type of the lens base materials each having a primer coat layer on the surface thereof and the conditions of the second removal step shown in Table 3 were employed, and the results are summarized in Table 4. In the evaluation of the liquid pool wrinkles (wrinkles) in Example 36, although it is described as "partially poor", it was confirmed that 90% (18 lenses) of the lenses were good quality and 10% (2 lenses) were slightly defective. The liquid pool width is an average value of 18 lenses of good quality.

Comparative Examples 4 and 5

Lens base materials each having the primer coat layer shown in Table 3 on the surface thereof were used (in Comparative Example 5, only a lens base material having good side surface was used). Lens base materials each having a photochromic coat layer were prepared in the same manner as in Example 22, except that the second removal step was not performed, and the results are shown in Table 4.

TABLE 3

| | | First removal step | | | Second removal step | | | |
| | | | | | Photochromic coat layer | | | |
| | Primer coat lens | Rotational speed (rpm) | Time (sec) | Adsorption member material | Adsorption member density (kg/m³) | Organic solvent amount (g/cm³) | Rotational speed (rpm) | Time (sec) | Contact force (g) |
|---|---|---|---|---|---|---|---|---|---|
| Example 22 | Example 3 | 900 | 6 | Melamine resin | 9.2 | 0.4 | 30 | 2 | 25 |
| Example 23 | Example 3 | 900 | 6 | | 9.2 | 0.2 | 30 | 2 | 25 |
| Example 24 | Example 3 | 900 | 6 | | 9.2 | 0.1 | 30 | 2 | 25 |
| Example 25 | Example 3 | 900 | 6 | | 9.2 | 0.6 | 30 | 2 | 25 |
| Example 26 | Example 3 | 900 | 6 | | 9.2 | 1.2 | 30 | 2 | 25 |
| Example 27 | Example 3 | 900 | 6 | | 9.2 | 0.4 | 30 | 2 | 10 |
| Example 28 | Example 3 | 900 | 6 | | 9.2 | 0.4 | 30 | 2 | 75 |
| Example 29 | Example 3 | 900 | 6 | | 9.2 | 0.4 | 30 | 2 | 120 |
| Example 30 | Example 11 | 900 | 6 | | 9.2 | 0.4 | 30 | 2 | 25 |
| Example 31 | Example 15 | 900 | 6 | | 9.2 | 0.4 | 30 | 4 | 15 |
| Example 32 | Example 3 | 900 | 6 | | 5.6 | 0.4 | 30 | 2 | 25 |
| Example 33 | Example 3 | 900 | 6 | Urethane resin | 12 | 0.4 | 30 | 2 | 25 |
| Example 34 | Example 3 | 900 | 6 | | 45.6 | 0.4 | 30 | 2 | 50 |
| Example 35 | Example 3 | 900 | 6 | Melamine resin | 9.2 | 0.4 | 120 | 1 | 25 |
| Example 36 | Example 3 | 900 | 6 | | 9.2 | 0.4 | 10 | 6 | 25 |
| Comparative Example 4 | Example 3 | 900 | 6 | | | | | | — |
| Comparative Example 5 | Example 15 | 900 | 6 | | | | | | — |

TABLE 4

| | Evaluation | | |
|---|---|---|---|
| | Liquid pool width (mm) | Liquid pool wrinkles | Edge surface yield (%) |
| Example 22 | <1 mm | Good | 100 |
| Example 23 | <1 mm | Good | 100 |
| Example 24 | <1 mm | Good | 100 |
| Example 25 | <1 mm | Good | 100 |
| Example 26 | <1 mm | Good | 100 |
| Example 27 | <1 mm | Good | 100 |
| Example 28 | <1 mm | Good | 100 |
| Example 29 | <1 mm | Good | 100 |
| Example 30 | <1 mm | Good | 100 |
| Example 31 | 2 mm | Good | 100 |
| Example 32 | <1 mm | Good | 100 |
| Example 33 | 1.5 mm | Good | 100 |
| Example 34 | 2 mm | Good | 100 |
| Example 35 | 2 mm | Good | 100 |
| Example 36 | <1 mm | Partially poor | 100 |
| Comparative Example 4 | 3 mm | Poor | 100 |
| Comparative Example 5 | 3.5 mm | Poor | 100 |

Example 37 (when Including Spatula Contacting Step)

A lens base material having the primer coat layer obtained in Example 3 on the surface thereof was used. 2 g of the photochromic liquid obtained as described above was supplied onto the primer coat layer of the lens base material, and the photochromic liquid was spread by rotating and holding at a rotational speed of 100 rpm for 30 seconds.
(First Removal Step)

Subsequently, the lens base material was rotated and held at a rotational speed of 900 rpm for 6 seconds, and at least a part of the excess photochromic liquid was shaken off.

<Spatula Contacting Step>

Next, a stainless steel metallic spatula having a blade edge angle of 15° and a blade edge thickness (thickness of the tip of the spatula in contact with the side surface of the lens base material) of 0.2 mm was prepared, and the metallic spatula was disposed such that the tip of the metallic spatula was in contact with the entire surface of the side surface of the obtained lens base material. While the metallic spatula was brought into contact with the side surface with a contact force of 70 g, the lens base material to which the photochromic liquid had been applied was rotated at 30 rpm for 2 seconds, thereby removing excess photochromic liquid on the side surface of the lens.

(Second Removal Step)

Next, A sponge (adsorption member) made of melamine resin having a density of 9.2 kg/m³ and a pore diameter of 50 to 400 μm was prepared. To be specific, a roller covered with an adsorption member having a thickness of 20 mm and a height of 30 mm was prepared around a rotatable rotating shaft. (A hollow sponge having a cylindrical center portion serving as a rotating shaft was prepared. The hollow sponge had a volume of 38 cm³ and a hardness of 320 N.) The sponge was impregnated with acetone at 0.4 g per 1 cm³ of the sponge.

The sponge was disposed so as to be in contact with the entire surface of the side surface of the lens base material obtained through the first removal step. (The uppermost position of the sponge was located above 0.5 mm from the uppermost position of the side surface, and the lowermost position of the sponge was located below 1.6 mm from the lowermost position of the side surface.)

While the sponge containing acetone was brought into contact with the side surface in the above-described state with a contact force of 25 g, the lens base material to which the photochromic liquid had been applied was rotated at 30 rpm for 2 seconds, thereby removing the liquid pool. The spreading of the photochromic liquid, the first removal step, and the second removal step were performed in an atmosphere having a humidity of 60% RH and a temperature of 23° C.

(Formation and Hardening of Photochromic Coat Layer)

A lens having a coating layer was produced in the same manner as in Example 1, except that an LED lamp having an output of 400 mW/cm² (peak wave length 385 nm, emission peak half-width 10 nm) was used as a light source for photocuring, and light was irradiated for 40 seconds. The photochromic coat layer had a thickness of 40 μm.

The width of the liquid pool remaining portion of the obtained lens was less than 1 mm, which was good, and wrinkles due to shrinkage unevenness caused by curing did not occur. In addition, no cured product adhered to the side surface.

The above-described steps were carried out under the same conditions to produce 20 lenses each having a photochromic coat layer. Table 7 shows the average value of the width of the remaining portion of the liquid pool for 20 lenses. The evaluation of the occurrence of wrinkles is shown in Table 7. There were no cured products adhering to the side surfaces of the 20 lenses.

The lens base materials used are summarized in Table 5, the above conditions are summarized in Table 6, and the results are summarized in Table 7.

Examples 38 to 44

Lens base materials each having a photochromic coat layer were produced in the same manner as in Example 37, except that the type of the lens base materials each having the primer coat layer on the surface shown in Table 5 and the conditions of the spatula contacting step and the second removal step shown in Table 6 were employed, and the results are summarized in Table 7.

TABLE 5

|  | Primer coat lens | |
|---|---|---|
|  | Lens used | Surface base curve |
| Example 37 | Example 3 | 1 |
| Example 38 | Example 3 | 1 |
| Example 39 | Example 3 | 1 |
| Example 40 | Example 11 | 3 |
| Example 41 | Example 14 | 4.75 |
| Example 42 | Example 15 | 6 |
| Example 43 | Example 15 | 6 |
| Example 44 | Example 15 | 6 |

TABLE 6

Photochromic coat layer

| | First removal step | Spatula contacting step | | | | | Second removal step | | | | | |
|---|---|---|---|---|---|---|---|---|---|---|---|---|
| | Rotational speed (rpm) | Rotational speed (rpm) | Spatula blade edge angle (°) | Spatula blade edge thickness (mm) | Rotational speed (rpm) | Time (sec) | Contact force (g) | Adsorption member material | Adsorption member density (kg/m³) | Organic solvent amount (g/cm³) | Rotational speed (rpm) | Time (sec) | Contact force (g) |
| Example 37 | 900 | 6 | 15 | 0.2 | 30 | 2 | 70 | Melamine resin | 9.2 | 0.4 | 30 | 2 | 25 |
| Example 38 | 900 | 6 | 15 | 0.2 | 60 | 1 | 70 | | 9.2 | 0.4 | 30 | 2 | 25 |
| Example 39 | 900 | 6 | 15 | 0.2 | 120 | 1 | 70 | | 9.2 | 0.4 | 30 | 2 | 25 |
| Example 40 | 900 | 6 | 15 | 0.2 | 30 | 2 | 70 | | 9.2 | 0.4 | 30 | 2 | 25 |
| Example 41 | 900 | 6 | 15 | 0.2 | 30 | 2 | 70 | | 9.2 | 0.4 | 30 | 2 | 25 |
| Example 42 | 900 | 6 | 15 | 0.2 | 30 | 2 | 70 | | 9.2 | 0.4 | 30 | 2 | 25 |
| Example 43 | 900 | 6 | 30 | 0.2 | 30 | 2 | 70 | | 9.2 | 0.4 | 30 | 2 | 25 |
| Example 44 | 900 | 6 | 45 | 0.5 | 30 | 2 | 70 | | 9.2 | 0.4 | 30 | 2 | 25 |

TABLE 7

| | Evaluation | | |
|---|---|---|---|
| | Liquid pool width (mm) | Liquid pool wrinkles | Edge surface yield (%) |
| Example 37 | <1 mm | Good | 100 |
| Example 38 | <1 mm | Good | 100 |
| Example 39 | <1 mm | Good | 100 |
| Example 40 | <1 mm | Good | 100 |
| Example 41 | <1 mm | Good | 100 |
| Example 42 | <1 mm | Good | 100 |
| Example 43 | 1.5 mm | Good | 100 |
| Example 44 | 2 mm | Good | 100 |

The invention claimed is:

1. A method of manufacturing coated lens comprising a lens base material and a coat layer formed on a surface of the lens base material, comprising:
   supplying a coating agent to the surface of the lens base material;

spreading the coating agent supplied to the surface by rotation of the lens base material;

removing at least a part of a liquid pool of the coating agent by rotation of the lens base material, the liquid pool generated on at least one of a peripheral edge portion and a side surface portion of the lens base material after the spreading the coating agent;

removing the liquid pool remaining on at least one of the peripheral edge portion and the side surface portion of the lens base material by bringing an adsorption member into contact with at least the side surface of the lens base material rotating with a rotational speed of 10 to 100 rpm; and curing the coating agent by light irradiation;

wherein the coat layer has a thickness of 10 to 100 μm, wherein the adsorption member comprises a melamine resin, wherein the coating agent is a photochromic curable composition containing a photochromic compound and a polymerizable monomer, wherein the viscosity at 25° C. of the photochromic curable composition is 20 to 5000 mPa·s, and wherein the adsorption member has a density of 5 to 20 kg/m$^3$.

2. The method according to claim 1, wherein the adsorption member contains an organic solvent.

3. The method according to claim 2, wherein the organic solvent is contained in an amount of 0.1 to 2 g per 1 cm$^3$ of the adsorption member.

4. The method according to claim 1, wherein the adsorption member comprises a foamed resin.

5. The method according to claim 1, wherein the coating agent is a primer composition containing at least one kind selected from the group consisting of an organic solvent, polyurethane, and a moisture-curable urethane.

6. The method according to claim 2, wherein the organic solvent comprises a ketone-based solvent.

7. The method according to claim 1, wherein the adsorption member has a hardness according to JIS K 6400-2 (method A) of 100 N to 500 N.

8. The method according to claim 1, wherein a rotational speed of the lens base material in the spreading the coating agent by the rotation of the lens base material is 10 to 500 rpm and a rotational speed of the lens base material in the step of removing at least a part of the liquid pool of the coating agent by the rotation of the lens base material is higher than 500 rpm and lower than or equal to 3000 rpm.

9. The method according to claim 1, wherein a pressing load of the adsorption member against the base lens material is 5 to 200 g.

10. The method according to claim 1, further comprising bringing into contact a spatula with at least the side surface of the lens base material after the removing the liquid pool by the rotation of the base lens material.

11. The method according to claim 1, comprising:

forming a first coating film in which the liquid pool is removed by the method according to claim 1, using a primer composition containing at least one kind selected from the group consisting of an organic solvent, polyurethane, and a moisture-curable urethane as the coating agent; and forming a second coating film in which the liquid pool is removed by the method according to claim 1 on the first coating film, using a photochromic curable composition containing a photochromic compound and a polymerizable monomer as the coating agent.

* * * * *